(12) United States Patent
Chung et al.

(10) Patent No.: US 12,264,961 B2
(45) Date of Patent: *Apr. 1, 2025

(54) SUPERCONDUCTING NANOWIRE SINGLE PHOTON DETECTOR AND METHOD OF FABRICATION THEREOF

(71) Applicant: PsiQuantum Corp., Palo Alto, CA (US)

(72) Inventors: Chia-Jung Chung, Sunnyvale, CA (US); Faraz Najafi, Palo Alto, CA (US); George Kovall, Campbell, CA (US); Vitor R. Manfrinato, San Jose, CA (US); Vimal Kamineni, Mechanicville, NY (US); Mark Thompson, Palo Alto, CA (US); Syrus Ziai, Los Altos, CA (US)

(73) Assignee: PSIQUANTUM CORP., Palo Alto, CA (US)

( * ) Notice: Subject to any disclaimer, the term of this patent is extended or adjusted under 35 U.S.C. 154(b) by 39 days.

This patent is subject to a terminal disclaimer.

(21) Appl. No.: 17/940,882

(22) Filed: Sep. 8, 2022

(65) Prior Publication Data
US 2024/0402004 A1   Dec. 5, 2024

Related U.S. Application Data

(63) Continuation of application No. 17/232,086, filed on Apr. 15, 2021, now Pat. No. 11,441,941, which is a
(Continued)

(51) Int. Cl.
*G01J 1/02*    (2006.01)
*G01J 1/44*    (2006.01)
*H01B 12/06*   (2006.01)

(52) U.S. Cl.
CPC .............. *G01J 1/0204* (2013.01); *G01J 1/44* (2013.01); *H01B 12/06* (2013.01); *G01J 2001/442* (2013.01)

(58) Field of Classification Search
CPC .......... G01J 1/0204; G01J 1/02; G01J 1/0209; G01J 1/44; G01J 2001/442;
(Continued)

(56) References Cited

U.S. PATENT DOCUMENTS 3,059,196 A   10/1962   Lentz
3,119,076 A    1/1964   Schlig et al.
(Continued)

FOREIGN PATENT DOCUMENTS

CN   106289515 A   1/2017
CN   106549099 A   3/2017
(Continued)

OTHER PUBLICATIONS

Akhlaghi et al., "Gated Mode 145:149 Superconducting Nanowire Single Photon Detectors," Optics Express, vol. 20, No. 2, Jan. 16, 2012, 9 pgs.
(Continued)

*Primary Examiner* — John R Lee
(74) *Attorney, Agent, or Firm* — Morgan, Lewis & Bockius LLP

(57) ABSTRACT

A superconductor device includes a barrier layer over a substrate including silicon, the barrier layer including silicon and nitrogen, and a seed layer for a superconductor layer over the barrier layer, the seed layer including aluminum and nitrogen, and superconductor layer over the seed layer, the superconductor layer including a layer of a superconductor material, the barrier layer serving as an oxidation barrier between the layer superconductor material and the substrate. In some embodiments, the superconductor device includes a
(Continued)

waveguide and a metal contact at a sufficient distance from the waveguide to prevent optical coupling between the metal contact and the waveguide.

20 Claims, 15 Drawing Sheets

Related U.S. Application Data continuation of application No. 16/849,829, filed on Apr. 15, 2020, now Pat. No. 11,009,387.

(60) Provisional application No. 62/834,924, filed on Apr. 16, 2019.

(58) Field of Classification Search
CPC . G01J 2001/4413; H01B 12/06; H01B 12/02; H01B 12/00; H10N 69/00; H10N 60/00; H10N 60/20; H10N 60/0202; H10N 60/203; H10N 60/205; H10N 60/207; H10N 60/208; H10N 60/80; H10N 60/82; H10N 60/83
See application file for complete search history.

(56) References Cited

U.S. PATENT DOCUMENTS

| | | | |
|---|---|---|---|
| 3,283,282 A | 11/1966 | Rosenberg | |
| 4,336,561 A | 6/1982 | Murphy | |
| 4,365,317 A | 12/1982 | Gheewala | |
| 4,509,146 A | 4/1985 | Wang et al. | |
| 4,647,954 A | 3/1987 | Graf et al. | |
| 4,904,869 A | 2/1990 | Schneider | |
| 4,989,051 A | 1/1991 | Whitehead et al. | |
| 5,006,705 A | 4/1991 | Saito et al. | |
| 5,026,682 A | 6/1991 | Clark et al. | |
| 5,030,614 A | 7/1991 | Hollander et al. | |
| 5,030,617 A | 7/1991 | Legge | |
| 5,041,880 A | 8/1991 | Nojima et al. | |
| 5,051,787 A | 9/1991 | Hasegawa | |
| 5,053,383 A | 10/1991 | Short et al. | |
| 5,127,928 A | 7/1992 | Farries et al. | |
| 5,173,620 A | 12/1992 | Fujimaki et al. | |
| 5,219,826 A | 6/1993 | Kapitulnik | |
| 5,247,475 A | 9/1993 | Hasunuma et al. | |
| 5,321,004 A | 6/1994 | Perez et al. | |
| 5,365,476 A | 11/1994 | Mukhanov | |
| 5,376,626 A | 12/1994 | Drehman et al. | |
| 5,455,519 A | 10/1995 | Ohori | |
| 5,481,119 A | 1/1996 | Higashino et al. | |
| 5,521,862 A | 5/1996 | Frazier | |
| 5,574,290 A | 11/1996 | You | |
| 5,719,105 A | 2/1998 | Odagawa et al. | |
| 5,825,240 A | 10/1998 | Geis et al. | |
| 5,831,278 A | 11/1998 | Berkowitz | |
| 5,892,644 A | 4/1999 | Evans | |
| 5,925,892 A | 7/1999 | Mizuno et al. | |
| 6,029,075 A | 2/2000 | Das et al. | |
| 6,078,517 A | 6/2000 | Herr | |
| 6,242,939 B1 | 6/2001 | Nagasawa | |
| 6,433,974 B2 | 8/2002 | Heismann | |
| 6,774,463 B1 | 8/2004 | Chaudhari et al. | |
| 6,900,714 B1 | 5/2005 | Huang et al. | |
| 7,227,438 B2 | 6/2007 | Song et al. | |
| 7,513,765 B2 | 4/2009 | Liao | |
| 7,558,030 B2 | 7/2009 | Lee et al. | |
| 7,589,323 B2 | 9/2009 | Tanaka et al. | |
| 7,724,083 B2 | 5/2010 | Herring et al. | |
| 7,847,282 B2 | 12/2010 | Sandhu | |
| 7,852,106 B2 | 12/2010 | Herr et al. | |
| 8,330,145 B2 | 12/2012 | Wakana et al. | |
| 8,565,844 B2 | 10/2013 | Smith | |
| 8,577,430 B1 | 11/2013 | Smith | |
| 8,736,085 B2 | 5/2014 | Sines | |
| 9,240,539 B2 | 1/2016 | Nam et al. | |
| 9,293,240 B2 | 3/2016 | Kroulik | |
| 9,443,576 B1 | 9/2016 | Miller | |
| 9,500,519 B2 | 11/2016 | Tang et al. | |
| 9,509,315 B2 | 11/2016 | McCaughan et al. | |
| 9,853,645 B1 | 12/2017 | Mukhanov et al. | |
| 9,876,505 B1 | 1/2018 | Dai et al. | |
| 9,954,158 B2 | 4/2018 | You et al. | |
| 9,998,122 B2 | 6/2018 | Hamilton et al. | |
| 10,103,736 B1 | 10/2018 | Powell et al. | |
| 10,133,986 B1 | 11/2018 | Newton et al. | |
| 10,171,086 B2 | 1/2019 | McCaughan et al. | |
| 10,177,298 B1 | 1/2019 | Taylor et al. | |
| 10,186,858 B2 | 1/2019 | Klaus et al. | |
| 10,197,440 B2 | 2/2019 | Najafi | |
| 10,262,776 B2 | 4/2019 | Choi et al. | |
| 10,361,703 B2 | 7/2019 | Najafi | |
| 10,386,229 B2 | 8/2019 | Najafi et al. | |
| 10,396,733 B2 | 8/2019 | Najafi et al. | |
| 10,454,014 B2 | 10/2019 | Najafi et al. | |
| 10,454,016 B2 | 10/2019 | Fong et al. | |
| 10,566,516 B2 | 2/2020 | Najafi | |
| 10,573,800 B1 | 2/2020 | Najafi | |
| 10,586,910 B2 | 3/2020 | Najafi | |
| 10,620,044 B2 | 4/2020 | Thompson et al. | |
| 10,651,325 B2 | 5/2020 | Najafi et al. | |
| 10,879,905 B2 | 12/2020 | Najafi et al. | |
| 10,897,235 B2 | 1/2021 | Najafi et al. | |
| 10,911,031 B2 | 2/2021 | Wise et al. | |
| 10,944,403 B2 | 3/2021 | Najafi | |
| 10,984,857 B2 | 4/2021 | Najafi | |
| 11,009,387 B2 * | 5/2021 | Chung | H10N 60/0156 |
| 11,313,719 B2 | 4/2022 | Najafi et al. | |
| 11,441,941 B2 * | 9/2022 | Chung | G01J 1/0204 |
| 11,473,974 B2 | 10/2022 | Thompson et al. | |
| 11,629,995 B2 | 4/2023 | Najafi et al. | |
| 2002/0110328 A1 | 8/2002 | Bischel et al. | |
| 2002/0149453 A1 | 10/2002 | Snitchler et al. | |
| 2003/0087503 A1 | 5/2003 | Sakaguchi et al. | |
| 2005/0153843 A1 | 7/2005 | Kubota | |
| 2005/0197254 A1 | 9/2005 | Stasiak et al. | |
| 2006/0073979 A1 | 4/2006 | Thieme et al. | |
| 2006/0183327 A1 | 8/2006 | Moon | |
| 2006/0270224 A1 | 11/2006 | Song et al. | |
| 2008/0026234 A1 | 1/2008 | Sambasivan et al. | |
| 2008/0197285 A1 | 8/2008 | Frey et al. | |
| 2008/0272302 A1 | 11/2008 | Frey et al. | |
| 2009/0014433 A1 | 1/2009 | O'Neil et al. | |
| 2010/0026447 A1 | 2/2010 | Keefe et al. | |
| 2010/0171098 A1 | 7/2010 | Suzuki | |
| 2011/0108803 A1 | 5/2011 | Deligianni et al. | |
| 2011/0116742 A1 | 5/2011 | Chang et al. | |
| 2011/0254053 A1 | 10/2011 | Goupil et al. | |
| 2013/0012392 A1 | 1/2013 | Tanaka et al. | |
| 2013/0090244 A1 | 4/2013 | Shinzato et al. | |
| 2013/0124112 A1 | 5/2013 | Heath et al. | |
| 2013/0143744 A1 | 6/2013 | Marsili et al. | |
| 2013/0150247 A1 | 6/2013 | Reeves et al. | |
| 2013/0341594 A1 | 12/2013 | Mohseni et al. | |
| 2014/0103196 A1 | 4/2014 | Soga et al. | |
| 2014/0113828 A1 | 4/2014 | Gilbert et al. | |
| 2014/0299751 A1 | 10/2014 | Tang et al. | |
| 2015/0018218 A1 | 1/2015 | Lakrimi et al. | |
| 2015/0179916 A1 | 6/2015 | Pramanik et al. | |
| 2015/0348681 A1 | 12/2015 | Huh | |
| 2016/0028402 A1 | 1/2016 | McCaughan et al. | |
| 2016/0028403 A1 | 1/2016 | McCughan et al. | |
| 2016/0356708 A1 | 12/2016 | Bennett et al. | |
| 2017/0186933 A1 | 6/2017 | Sunter et al. | |
| 2018/0033944 A1 | 2/2018 | Ladizinsky et al. | |
| 2018/0145664 A1 | 5/2018 | Herr et al. | |
| 2018/0335343 A1 | 11/2018 | Najafi et al. | |
| 2018/0364097 A1 | 12/2018 | Najafi | |
| 2018/0374979 A1 | 12/2018 | Nozawa | |
| 2019/0027672 A1 | 1/2019 | Megrant | |
| 2019/0035904 A1 | 1/2019 | Najafi | |
| 2019/0035999 A1 | 1/2019 | Najafi | |
| 2019/0044051 A1 | 2/2019 | Caudillo et al. | |
| 2019/0109595 A1 | 4/2019 | Najafi | |

(56) References Cited

U.S. PATENT DOCUMENTS

| | | |
|---|---|---|
| 2019/0148848 A1 | 5/2019 | Najafi et al. |
| 2019/0227230 A1 | 7/2019 | Novack et al. |
| 2019/0288132 A1 | 9/2019 | Wang et al. |
| 2019/0378874 A1 | 12/2019 | Rosenblatt et al. |
| 2020/0027502 A1 | 1/2020 | Berggren et al. |
| 2020/0066962 A1 | 2/2020 | Najafi |
| 2020/0080890 A1 | 3/2020 | Najafi et al. |
| 2020/0111944 A1 | 4/2020 | Moodera et al. |
| 2020/0176662 A1 | 6/2020 | Dayton et al. |
| 2020/0194656 A1 | 6/2020 | Najafi |
| 2020/0256722 A1 | 8/2020 | Najafi et al. |
| 2021/0119102 A1 | 4/2021 | Zhu et al. |
| 2021/0183767 A1 | 6/2021 | Najafi et al. |
| 2021/0239518 A1 | 8/2021 | Chung et al. |
| 2021/0384878 A1 | 12/2021 | Najafi et al. |
| 2023/0175887 A1 | 6/2023 | Najafi et al. |
| 2023/0213380 A1 | 7/2023 | Thompson et al. |
| 2024/0339978 A1 | 10/2024 | Najafi et al. |
| 2024/0369408 A1 | 11/2024 | Thompson et al. |
| 2024/0410749 A1 | 12/2024 | Najafi et al. |

FOREIGN PATENT DOCUMENTS

| | | |
|---|---|---|
| DE | 2440576 B1 | 1/1976 |
| DE | 19714191 C1 | 7/1998 |
| EP | 0299879 A2 | 1/1989 |
| EP | 1965184 A1 | 9/2008 |
| GB | 2530500 A | 3/2016 |
| JP | S63299282 A | 12/1988 |
| JP | H0555647 A | 3/1993 |
| WO | WO90/14715 A1 | 11/1990 |
| WO | WO94/09566 A1 | 4/1994 |
| WO | WO2012052628 A2 | 4/2012 |

OTHER PUBLICATIONS

Atikian, Haig A. et al., "Superconducting Nanowire Single Photon Detector on Diamond," arXiv:1401.4490v1, physics optics, Jan. 17, 2014, 5 pgs.

Cheng, Risheng et al., "Photon-Number-Resolving Detector Based on Superconducting Serial Nanowires," IEEE Transactions on Applied Superconductivity, vol. 23, No. 1, Feb. 2013, 9 pgs.

Clem, John R. et al., "Geometry-dependent critical currents in superconducting nanocircuits," arXiv:1109.4881v1 [cond-mat.supr-con] Sep. 22, 2011, 29 pgs.

Dai, Daoxin et al., "Mode conversion in tapered submicron silicon ridge optical waveguides," Optics Express, vol. 20, No. 12, Jun. 4, 2012, 15 pgs.

Henrich, D. et al., "Geometry-inducted reduction of the critical current in superconducting nanowires," arXiv:1204.0616v2 [cond-mat-supr-con] Aug. 22, 2012, 6 pgs.

Hortensius, H.L. et al., "Critical-Current Reduction in Thin Superconducting Wires Due to Current Crowding," arXiv:1203.4253v3, [cond-mat-supr-con], May 6, 2012, 5 pgs.

Korzh, B.A. et al., "Demonstrating sub-3 ps temporal resolution in a superconducting nanowire single-photon detector," Apr. 18, 2018, 26 pgs.

Lee, S.-B. et al., "Fabrication of a self-aligned superconducting nanotransistor based NOR logic gate," Microelectronic Engineering 57-58, 2001, 7 pgs., downloaded from https://www.sciencedirect.com/science/article/abs/pii/S0167931701004269).

Marsili, F., "Single-photon detectors based on ultra-narrow superconducting nanowires," Massachusetts Institute of Technology, Department of Electrical Engineering and Computer Science, Dec. 19, 2010, 31 pgs.

Mattioli, Francesco et al., "Photon-number-resolving superconducting nanowire detectors," Superconductor Science and Technology, Aug. 24, 2015, 16 pgs.

McGaughan, "Superconducting thin film nanoelectronics," Sep. 2015, Massachusetts Institute of Technology, submitted to the Department of Electrical Engineering and Computer Science in partial fulfillment of the requirements for the degree of Doctor of Philosophy in Electrical Engineering, 22 pgs.

Murphy et al., "Nanoscale superconducting memory based on the kinetic inductance of asymmetric nanowire loops," Department of Physics, University of Illinois at Urbana-Champaign, arXiv:1701.08715v2 [cond-mat.supr-con] Jun. 29, 2017, 19 pgs.

Natarajan et al., "Superconducting nanowire single-photon detectors: physics and applications", 2012, Superconduc. Sci. Technology vol. 25, 17 pgs.

Quaranta et al., Superconductive Three-Terminal Amplifier/Discriminator, IEEE Transactions on Applied Superconductivity, vol. 19, No. 3, Jun. 2, 2009, 4 pgs.

Schmidt, E. et al., AIN-Buffered Superconducting NbN Nanowire Single-Photon Detector on GaAs, IEEE Transactions on Applied Superconductivity, vol. 27, No. 4, Jun. 2017, 5 pgs.

Shiino, Tatsuya et al., "Improvement of Critical Temperature of Superconducting NbTiN and NbN Thin Films Using the AIN Buffer Layer," Superconductor Science and Technology, Mar. 2010, 11 pgs.

Zhao, Qing-Yuan et al., "A compact superconducting nanowire memory element operated by nanowire cryotrons," Massachusetts Institute of Technology, Department of Electrical Engineering and Computer Science, Nov. 22, 2017, 20 pgs.

McCaughan, A.N., et al., "Using Geometry to Sense Current," Nano Letters 16 (2016), 6 pgs.

Saraswat et al., "Highly oriented, free-standing, superconducting NbN films growth on chemical vapor deposited graphene," APL Materials 2, 056103 (2014); https://doi.org/10.1063/1.4875356 (Year: 2014), 7 pgs.

Stanfield, CMOS-Compatible, Piezo-Optomechanically Tunable Photonics for Visible Wavelengths and Cryogenic Temperatures, vol. 27, Issue 20, pp. 28588-28605, 2019, 18 pgs.

D. Sahin et al., "Waveguide photon-number-resolving detectors for quantum photonic integrated circuits", Appl. Phys. Lett., vol. 103, No. 11, p. 111116, Sep. 2013, 16 pgs.

Sergio Pagano et al., "Nano-Strip Three-Terminal Superconducting Device for Cryogenic Detector Readout", IEEE Transactions on Applied Superconductivity, vol. 21, No. 3, Jun. 2011, 4 pgs.

PsiQuantum Corp., International Search Report and Written Opinion, PCT/US2018/033042, Aug. 28, 2018, 13 pgs.

PsiQuantum Corp., International Search Report and Written Opinion, PCT/US2018/033041, Jul. 27, 2018, 16 pgs.

PsiQuantum Corp., International Search Report and Written Opinion, PCT/US2018/044091, Nov. 7, 2018, 12 pgs.

PsiQuantum Corp., Invitation to Pay Additional Fees/Partial Search Report, PCT/US2018/037892, Aug. 20, 2018, 12 pgs.

PsiQuantum Corp., Invitation to Pay Additional Fees/Partial Search Report, PCT/US2018/054414, Jan. 24, 2019, 21 pgs.

PsiQuantum Corp., International Search Report and Written Opinion, PCT/US2018/054414, Mar. 20, 2019, 21 pgs.

Najafi, Non-Final Office Action dated Dec. 12, 2018, U.S. Appl. No. 16/028,288, 6 pgs.

Najafi, Notice of Allowance dated Apr. 5, 2019, U.S. Appl. No. 16/028,288, 10 pgs.

Najafi, Non-Final Office Action dated Sep. 21, 2018, U.S. Appl. No. 16/028,293, 8 pgs.

Najafi, Final Office Action dated Mar. 1, 2019 U.S. Appl. No. 16/028,293, 5 pgs.

Najafi, Notice of Allowance dated Sep. 21, 2018, U.S. Appl. No. 16/012,520, 9 pgs.

Najafi, Non-Final Office Action, U.S. Appl. No. 16/136,124, Apr. 4, 2019, 9 pgs.

Najafi, Quayle Office Action, U.S. Appl. No. 16/151,180, Jan. 31, 2019, 5 pgs.

Najafi, Notice of Allowance, U.S. Appl. No. 16/151,180, Mar. 14, 2019, 5 pgs.

Najafi, Notice of Allowance U.S. Appl. No. 16/151,190, dated Feb. 6, 2019, 11 pgs.

Najafi, Notice of Allowance U.S. Appl. No. 16/151,190, dated Mar. 28, 2019, 5 pgs.

Najafi, Office Action, U.S. Appl. No. 16/046,815, Feb. 4, 2019, 9 pgs.

(56) References Cited

OTHER PUBLICATIONS

Najafi, Office Action, U.S. Appl. No. 16/046,807, Mar. 18, 2019, 10 pgs.
Najafi, Office Action, U.S. Appl. No. 16/107,143, Mar. 19, 2019, 11 pgs.
Psiquantum Corp., International Search Report and Written Opinion, PCT/US2019/017687, Apr. 30, 2019, 8 pgs.
Psiquantum Corp., International Search Report, PCT/US2019/017691, Apr. 23, 2019, 7 pgs.
Psiquantum Corp., International Search Report and Written Opinion, PCT/US2019/030019, Jul. 17, 2019, 8 pgs.
Psiquantum Corp., PCT/US2018/044091, International Preliminary Report on Patentability, Jan. 28, 2020, 6 pgs.
Najafi, Non-Final Office Action, U.S. Appl. No. 16/664,716, filed Apr. 1, 2020, 15 pgs.
Psiquantum, International Search Report and Written Opinion, PCT/US2019/051853, Jan. 27, 2020, 13 pgs.
Psiquantum, International Preliminary Report on Patentability, PCT/US12018/033041, Nov. 26, 2019, 8 pgs.
Psiquantum, International Preliminary Report on Patentability, PCT/US2018/054414, Apr. 8, 2020, 15 pgs.
Psiquantum, International Search Report / Written Opinion, PCT/US2018/037892, Oct. 17, 2018, 18 pgs.
Psiquantum, International Preliminary Report on Patentability, PCT/US2018/037892, Dec. 17, 2019, 12 pgs.
Najafi, Non-Final Office Action, U.S. Appl. No. 16/553,068, Apr. 1, 2020, 11 pgs.
Najafi, Non-Final Office Action, U.S. Appl. No. 16/544,718, Aug. 17, 2020, 7 pgs.
Najafi, Non-Final Office Action, U.S. Appl. No. 16/656,506, Aug. 13, 2020, 18 pgs.
Najafi, Notice of Allowance, U.S. Appl. No. 16/553,068, Sep. 18, 2020, 8 pgs.
Najafi, Notice of Allowance, U.S. Appl. No. 16/473,550, Sep. 24, 2020, 9 pgs.
Najafi, Notice of Allowance, U.S. Appl. No. 16/656,506, Nov. 3, 2020, 12 pgs.
Najafi, Final Office Action, U.S. Appl. No. 16/664,716, Oct. 16, 2020, 14 pgs.
Najafi, Notice of Allowance, U.S. Appl. No. 16/473,547, Dec. 9, 2020, 8 pgs.
Najafi, Notice of Allowance, U.S. Appl. No. 16/543,256, Dec. 9, 2020, 12 pgs.
Chung, Non-Final Office Action, U.S. Appl. No. 16/849,829, Aug. 21, 2020, 7 pgs.
Chung, Notice of Allowance, U.S. Appl. No. 16/849,829, Dec. 8, 2020, 5 pgs.
Psiquantum Corp, International Search Report and Written Opinion, PCT/US2020/028519, Jan. 12, 2021, 9 pgs.
Psiquantum Corp., Notice of Allowance, U.S. Appl. No. 16/849,829, Mar. 1, 2021, 8 pgs.
Psiquantum Corp., Notice of Allowance, U.S. Appl. No. 16/544,718, Feb. 5, 2021, 6 pgs.
Psiquantum Corp., Notice of Allowance, U.S. Appl. No. 16/664,716, Jan. 28, 2021, 8 pgs.
Psiquantum, Notice of Allowance U.S. Appl. No. 16/840,166, Mar. 23, 2021, 8 pgs.
Psiquantum, Notice of Allowance, U.S. Appl. No. 16/664,716, Apr. 21, 2021, 8 pgs.
Psiquantum, Notice of Allowance, U.S. Appl. No. 16/575,274, Apr. 22, 2021, 11 pgs.
Psiquantum, International Preliminary Report on Patentability, PCT/US2018/033042, Nov. 19, 2019, 7 pgs.
Psiquantum, International Preliminary Report on Patentability, PCT/US2019/051853, Mar. 23, 2021, 10 pgs.
Psiquantum, International Preliminary Report on Patentability, PCT/US2019/017687, Aug. 18, 2020, 6 pgs.
Psiquantum, International Preliminary Report on Patentability, PCT/US2019/030019, Nov. 3, 2020, 7 pgs.
Psiquantum, Notice of Allowance, U.S. Appl. No. 16/840,166, May 24, 2021, 5 pgs.
Najafi, Non-Final Office Action, U.S. Appl. No. 17/135,861, Sep. 23, 2021, 7 pgs.
Psiquantum, International Preliminary Report on Patentability, PCT/US2019/016885, Aug. 11, 2020, 7 pgs.
Psiquantum, International Search Report and Written Opinion, PCT/US2019/016885, Apr. 24, 2019, 9 pgs.
Thompson, Non-Final Office Action, U.S. Appl. No. 16/450,911, Aug. 2, 2019, 7 pgs.
Thompson, Notice of Allowance U.S. Appl. No. 16/450,911, Dec. 11, 2019, 5 pgs.
Thompson, Non-Final Office Action, U.S. Appl. No. 16/985,137, Sep. 30, 2021, 7 pgs.
Thompson, Notice of Allowance, U.S. Appl. No. 16/985,137, May 26, 2022, 9 pgs.
Najafi, Notice of Allowance, U.S. Appl. No. 16/046,807, Oct. 29, 2019, 8 pgs.
Najafi, Notice of Allowance, U.S. Appl. No. 16/136,124, Jun. 27, 2019, 8 pgs.
Psiquantum Corp., International Search Report and Written Opinion, PCT/US2018/060802, Apr. 8, 2019, 18 pgs.
Psiquantum, International Preliminary Report on Patentability, PCT/US2018/060802, May 19, 2020, 13 pgs.
Najafi, Notice of Allowance, U.S. Appl. No. 16/773,921, Sep. 22, 2021, 9 pgs.
Najafi, Notice of Allowance, U.S. Appl. No. 17/195,522, Nov. 12, 2021, 9 pgs.
Najafi, Notice of Allowance, U.S. Appl. No. 17/195,522, Nov. 16, 2021, 2 pgs.
Najafi, Notice of Allowance, U.S. Appl. No. 16/773,921, Nov. 15, 2021, 9 pgs.
Najafi, Notice of Allowance, U.S. Appl. No. 17/033,337, Dec. 9, 2021, 9 pgs.
Chung, Non-Final Office Action, U.S. Appl. No. 17/232,086, Dec. 16, 2021, 14 pgs.
Chung, Notice of Allowance, U.S. Appl. No. 17/232,086, May 11, 2022, 6 pgs.
Najafi, Notice of Allowance, U.S. Appl. No. 17/135,861, Jan. 28, 2022, 7 pgs.
Thompson, Non-Final Office Action, U.S. Appl. No. 16/985,137, Jan. 18, 2022, 8 pgs.
Najafi, Notice of Allowance, U.S. Appl. No. 16/623,503, Feb. 22, 2022, 10 pgs.
Najafi, Non-Final Office Action, U.S. Appl. No. 16/813,628, Mar. 7, 2022, 8 pgs.
Najafi, Final Office Action, U.S. Appl. No. 16/813,628, Aug. 29, 2022, 9 pgs.
Najafi, Non-Final Office Action, U.S. Appl. No. 16/813,628, Dec. 6, 2022, 8 pgs.
Najafi, Notice of Allowance, U.S. Appl. No. 16/813,628, Jun. 28, 2023, 8 pgs.
Najafi, Notice of Allowance, U.S. Appl. No. 18/103,413, Jul. 18, 2023, 9 pgs.
Najafi, Non-Final Office Action, U.S. Appl. No. 17/150,889, Sep. 14, 2023, 9 pgs.
Najafi, Non-Final Office Action, U.S. Appl. No. 17/160,283, Mar. 31, 2022, 18 pgs.
Najafi, Non-Final Office Action, U.S. Appl. No. 17/234,701, Feb. 1, 2022, 14 pgs.
Najafi, Non-Final Office Action, U.S. Appl. No. 16/840,182, Apr. 29, 2022, 12 pgs.
Najafi, Non-Final Office Action, U.S. Appl. No. 17/967,773, Oct. 20, 2023, 10 pgs.
Najafi, Non-Final Office Action, U.S. Appl. No. 17/098,235, Oct. 20, 2023, 16 pgs.
Najafi, Non-Final Office Action, U.S. Appl. No. 18/103,413, Nov. 7, 2023, 7 pgs.
Najafi, Notice of Allowance, U.S. Appl. No. 18/103,413, Jan. 18, 2024, 8 pgs.
Najafi, Final Office Action, U.S. Appl. No. 17/967,773, Jan. 18, 2024, 12 pgs.

(56) References Cited

OTHER PUBLICATIONS

Najafi, Notice of Allowance, U.S. Appl. No. 17/098,235, Jan. 24, 2024, 5 pgs.
Najafi, Notice of Allowance, U.S. Appl. No. 17/150,889, Feb. 5, 2024, 8 pgs.
Najafi et al., Non-Final Office Action, U.S. Appl. No. 18/639,722, Nov. 4, 2024, 24 pgs.

* cited by examiner

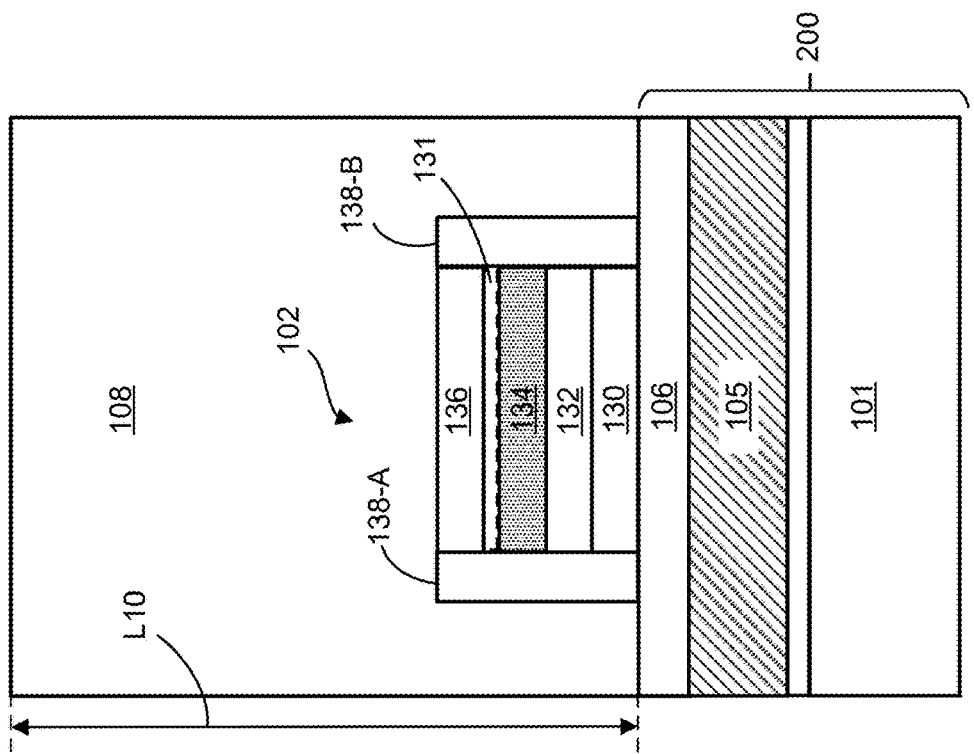
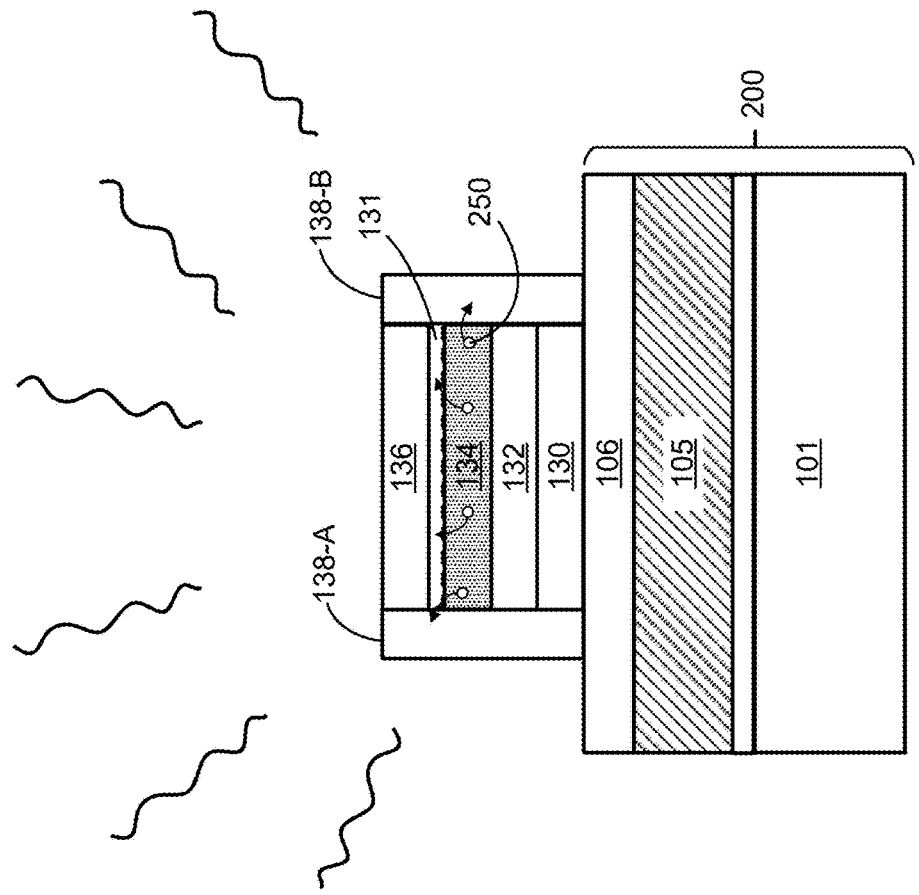
Figure 2K
Figure 2L

SUPERCONDUCTING NANOWIRE SINGLE PHOTON DETECTOR AND METHOD OF FABRICATION THEREOF

CROSS REFERENCE TO RELATED APPLICATIONS

The application which is a continuation of U.S. patent application Ser. No. 17/232,086, filed Apr. 15, 2021, which is a continuation of U.S. patent application Ser. No. 16/849,829, filed Apr. 15, 2020, now U.S. Pat. No. 11,009,387, which claims priority to U.S. Provisional Application No. 62/834,924, filed Apr. 16, 2019, entitled "Superconducting Nanowire Single Photon Detector and Method of Fabrication Thereof," which are incorporated by reference herein in their entirety.

TECHNICAL FIELD

This relates generally to photonic devices and, more specifically, to a superconducting nanowire single photon detector and method of fabrication thereof.

BACKGROUND

A superconducting nanowire single photon detector (SNSPD) can have a high sensitivity to single photon events. During operation, a nanowire in the SNSPD can be cooled to, for example, 2.5 K, well below its superconducting critical temperature. Upon absorption of a photon in the nanowire, superconductivity is locally broken, and a change in current is detected as a voltage pulse by associated amplification electronics. In many configurations, the SNSPD's critical temperature depends on the quality of a thin film of material forming the nanowire, with lower quality films exhibiting lower critical temperatures. Therefore, significant research efforts have been devoted to improving the design and quality of thin films for SNSPDs in order to achieve higher operation temperatures.

SUMMARY

A superconductor device according to some embodiments comprises a superconductor stack, which includes a barrier layer (e.g., a layer including silicon and nitrogen), a seed layer over the barrier layer, a superconductor layer over the seed layer, and a silicon cap layer over the superconductor layer, the silicon cap layer including amorphous silicon, polysilicon, or single-crystal silicon. In some embodiments, the silicon cap layer includes amorphous silicon (or a-Si), as a-Si can be deposited at relative low temperature (e.g., ~75 degrees Celsius) with little or no damage to the underlying superconductor layer. In some embodiments, the superconductor stack further comprises sidewalls adjacent to the barrier layer, the seed layer, the superconductor layer, and the silicon cap layer. In some embodiments, the seed layer includes aluminum and nitrogen (e.g., aluminum nitride), the superconductor layer includes niobium and one or more of nitrogen, titanium, aluminum, germanium, and tin (e.g., NbN, NbTi, NbAl, NbGe, NbSn, etc.), the sidewalls includes silicon and nitrogen (e.g., silicon nitride). In some embodiments, the superconductor layer includes niobium nitride. In some embodiments, the superconductor stack further comprises a protective layer between the superconductor layer and the silicon cap layer. The optional protective layer helps to prevent oxidation of the superconductor layer during fabrication of the superconductor stack. In some embodiments, the protective layer includes aluminum and nitrogen (e.g., aluminum nitride). In some embodiments, the superconductor stack is adjacent to one or more dielectric layers (e.g., silicon dioxide). The barrier layer and the sidewalls function as barriers between superconducting layer and the one or more dielectric layers, preventing or reducing oxidation of superconducting layer from any oxygen released from one or more dielectric layers during and/or after fabrication of the superconductor stack.

The superconductor device further comprises a metal contact over a portion of the silicon cap layer and electrically-coupled to a portion of the superconductor layer. In some embodiments, the portion of the silicon cap layer is converted from amorphous silicon to a conductive compound to provide electrical coupling between the superconductor layer and the metal contact. In some embodiments, the metal contact comprises a core including a first metal, and an outer layer around the core that includes a second metal. In some embodiments, the conductive compound is a metal compound (e.g., metal silicide) including the second metal.

In some embodiments, the superconductor device further comprises a waveguide, and the first portion of the silicon cap layer under the metal contact is at a distance from the waveguide. The distance is sufficiently great to prevent optical coupling (e.g., evanescent coupling) between the metal contact and the waveguide. In some embodiments, the distance is dependent on a range of wavelengths of photons to be transferred via the waveguide. In some embodiments, the distance is at least 800 nm. In some embodiments, the waveguide is formed by patterning a semiconductor layer of a semiconductor-on-insulator wafer.

The superconductor device further comprises dielectric layer over the superconductor stack and a metal routing layer over the dielectric layer. The dielectric layer has a thickness sufficient to prevent optical coupling (e.g., evanescent coupling) between the waveguide and the metal routing layer. The thickness is dependent on a range of wavelengths of photons to be transferred via the waveguide. In some embodiments, the thickness is at least 800 nm.

A method of fabricating a superconductor device comprises obtaining a substrate including a semiconductor, and forming a multilayer film on the substrate. In some embodiments, forming the multilayer film comprises depositing a barrier layer, depositing a seed layer, depositing a superconductor layer, and depositing a silicon cap layer over the superconductor layer. In some embodiments, forming the multilayer film further comprises depositing a first protective layer after depositing the superconductor layer and before depositing the silicon cap layer. In some embodiments, the silicon cap layer including amorphous silicon, polysilicon, or single-crystal silicon, the superconductor layer includes a niobium and one or more of nitrogen, titanium, aluminum, germanium, and tin (e.g., NbN, NbTi, Nb$_3$Al, Nb$_3$Ge, Nb$_3$Sn, etc.), the seed layer includes aluminum and nitrogen (e.g., aluminum nitride), the barrier layer including silicon and nitrogen (e.g., silicon nitride).

In some embodiments, obtaining the substrate comprises patterning a semiconductor layer of a semiconductor-on-insulator wafer to form a waveguide, depositing a dielectric layer over the waveguide, and planarizing the dielectric layer.

The method of fabricating a superconductor device further comprises patterning the multilayer film to form a multilayer stack and, after forming the multilayer stack, depositing a protective layer over the multilayer stack, and anisotropically etching the second protective layer to form a plurality of sidewalls on the multilayer stack. In some embodiments, the protective layer includes silicon and nitrogen (e.g., silicon nitride). In some embodiments, after forming the sidewalls, a hydrogen anneal is applied to remove oxygen from the superconductor layer.

The method of fabricating a superconductor device further comprises, after forming the superconductor stack, depositing a dielectric layer, and forming an electrical contact through the dielectric layer to a portion of the superconductor layer. In some embodiments, forming the electrical contact comprises etching a cavity in the dielectric layer to expose a portion of the silicon cap layer, depositing a first metal to coat the portion of the silicon cap layer and exposed surfaces of the dielectric layer, converting the portion of the silicon cap layer into a conductive compound, and depositing a second metal to fill the cavity. In some embodiments, the materials for the silicon cap layer and the first metal are selected so as to enable silicide formation of the portion of the silicon cap layer at temperatures below 600 degrees Celsius. In some embodiment, the first metal is selected to be a metal capable of being deposited at temperatures below 600 degrees Celsius. In some embodiments, the material for the silicon cap layer and the dielectric layer are selected so as to allow etching the cavity through the dielectric layer without punching through the silicon cap layer.

In some embodiments, forming the electrical contact further comprises forming a metal pad or a metal line over the cavity, the metal pad or metal line being connected to the second metal.

BRIEF DESCRIPTION OF THE DRAWINGS

For a better understanding of the various described embodiments, reference should be made to the Detailed Description below, in conjunction with the following drawings in which like reference numerals refer to corresponding parts throughout the figures.

Like reference numerals refer to corresponding parts throughout the several views of the drawings. For ease of illustration, the drawings may not be drawn to scale unless stated otherwise.

DETAILED DESCRIPTION

Figure 1A:
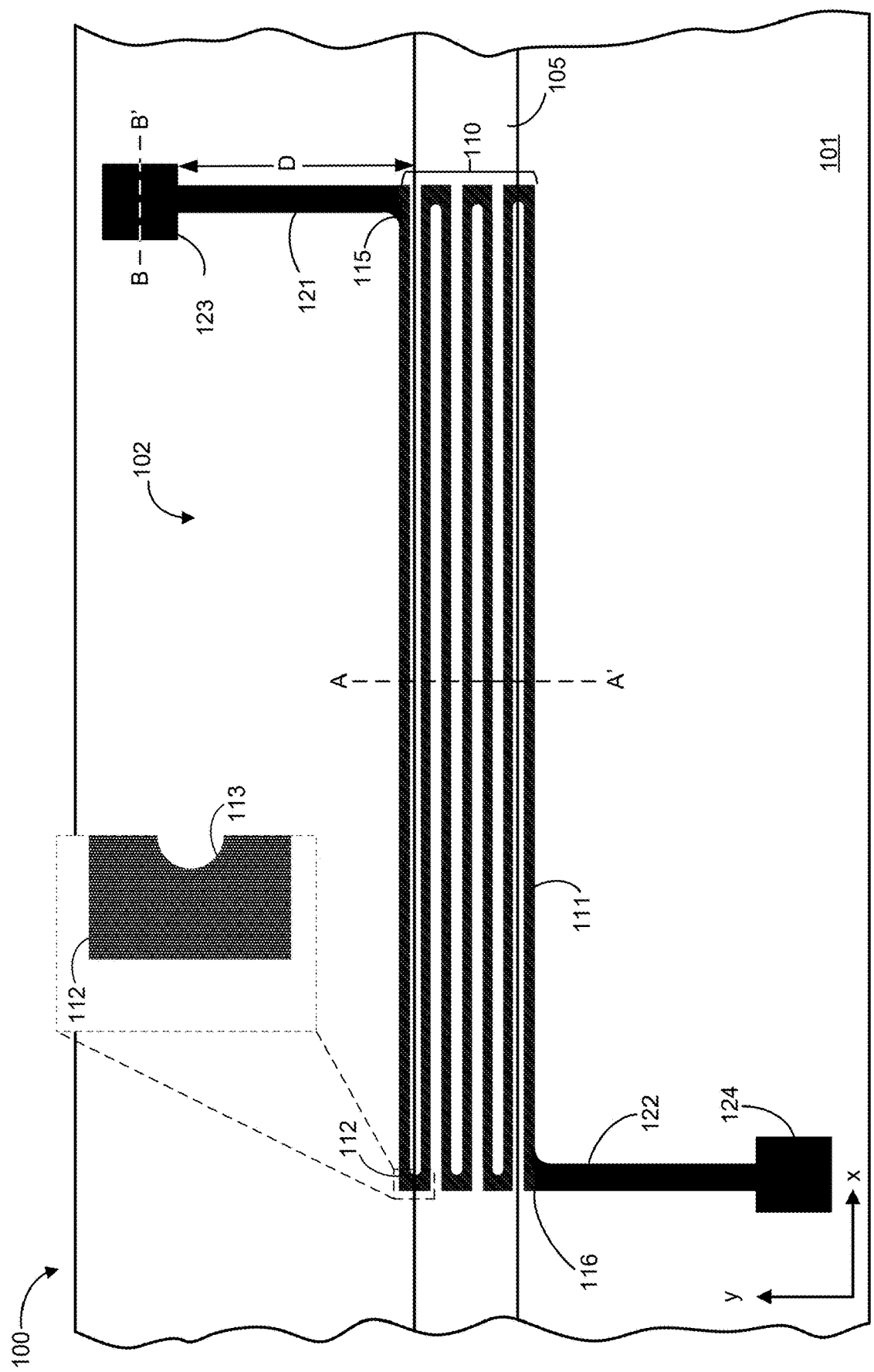
FIG. 1A illustrates a plan view of a superconducting nanowire single photon detector in accordance with some embodiments.

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

It will also be understood that, although the terms first, second, etc. are, in some instances, used herein to describe various elements, these elements should not be limited by these terms. These terms are used only to distinguish one element from another. For example, a first dielectric layer could be termed a second dielectric layer, and, similarly, a second dielectric layer could be termed a first dielectric layer, without departing from the scope of the various described embodiments. The first dielectric layer and the second dielectric layer are both dielectric layers, but they are not the same dielectric layer.

A1. In some embodiments, a superconductor device comprises: a barrier layer including silicon and nitrogen; a seed layer over the barrier layer, the seed layer including aluminum and nitrogen; a superconductor layer over the seed layer, the superconductor layer including a layer of a superconductor material; and a cap layer including silicon over the superconductor layer.

A2. In some embodiments, the superconductor device of A1 further comprises a metal contact. The cap layer has a converted portion including a conductive compound to provide electrical coupling between the superconductor layer and a metal contact, and the metal contact is over the conductive compound and electrically-coupled to the superconductor layer via the conductive compound.

A3. In some embodiments, in the superconductor device of A2, the metal contact comprises a core including a first metal; and an outer layer around the core and including a second metal; the conductive compound includes a silicide of the second metal.

A4. In some embodiments, the superconductor device of any of A2-A3 further comprises a waveguide; and the metal contact is at a sufficient lateral distance from the waveguide to prevent optical coupling between the metal contact and the waveguide.

A5. In some embodiments, in the superconductor device of A4, the lateral distance is at least 800 nm.

A6. In some embodiments, the superconductor device of any of A1-A5 further comprises: a dielectric layer over the cap layer; and a metal routing layer over the dielectric layer, the dielectric layer has a thickness sufficient to prevent optical coupling between the waveguide and the metal routing layer.

A7. In some embodiments, in the superconductor device of A6, the thickness is at least 800 nm.

A8. In some embodiments, the superconductor device of any of A1-A7 further comprises: a substrate; a waveguide over the substrate; and a dielectric layer over the waveguide, the barrier layer is over the dielectric layer.

A9. In some embodiments, in the superconductor device of A8, the substrate is part of a semiconductor-on-insulator substrate having a semiconductor layer on an insulator layer, and the waveguide includes a portion of the semiconductor layer.

A10. In some embodiments, the superconductor device of any of A1-A9 further comprises: sidewalls adjacent to the barrier layer, the seed layer, the superconductor layer, and the cap layer, the sidewalls include silicon and nitrogen.

A11. In some embodiments, in the superconductor device of any of A1-A10, the superconductor material includes niobium and one or more of nitrogen, titanium, aluminum, germanium, and tin.

A12. In some embodiments, in the superconductor device of any of A1-A10, the superconductor material includes niobium nitride.

A13. In some embodiments, in the superconductor device of any of A1-A12, the cap layer includes one or more of amorphous silicon, polysilicon, and single-crystal silicon.

A14. In some embodiments, in the superconductor device of any of A1-A12, the cap layer includes amorphous silicon.

A15. In some embodiments, the superconductor device of any of A1-A14 further comprises a protective layer between the superconductor layer and the cap layer, the protective layer including aluminum and nitrogen.

A16. In some embodiments, in the superconductor device of A15, the protective layer is 5-10 nm thick.

A17. A method of manufacturing a superconductor device comprises depositing a barrier layer over a substrate including silicon, the barrier layer including silicon and nitrogen; depositing a seed layer over the barrier layer, the seed layer including aluminum and nitrogen; depositing a superconductor layer over the seed layer, the superconductor layer including a layer of a superconductor material; and depositing a silicon cap layer over the superconductor layer.

A18. In some embodiments, the method of A17 further comprises patterning the silicon cap layer, the superconductor layer, the seed layer and the barrier layer to form a multilayer stack.

A19. In some embodiments, the method of A18 further comprises, after forming the multilayer stack: depositing a layer of protective material over the multilayer stack; and anisotropically etching the layer of protective material to form a plurality of sidewalls on sides of the multilayer stack.

A20. In some embodiments, the method of A19 further comprises, after forming the sidewalls, applying a hydrogen anneal to remove oxygen from the superconductor layer.

A21. In some embodiments, the method of any of A18-A20 further comprises, after forming the multilayer stack: depositing a dielectric layer; and forming an electrical contact through the dielectric layer to a portion of the superconductor layer. In some embodiments, forming the electric contact comprises: etching a cavity in the dielectric layer to expose a portion of the silicon cap layer in the dielectric layer; depositing a first metal to coat the portion of the silicon cap layer and exposed surfaces of the dielectric layer; converting the portion of the silicon cap layer into a conductive compound; and depositing a second metal to fill the cavity.

A22. In some embodiments, in the method of A21, forming the electrical contact further comprises forming a metal pad or a metal line over the cavity, the metal pad or metal line being connected to the second metal.

A23. In some embodiments, in the method of any of A21-A22, the first metal is selected from the group consisting of titanium, nickel, and cobalt.

A24. In some embodiments, in the method of A23, the second metal is selected from the group consisting of tungsten, aluminum, and copper.

A25. In some embodiments, in the method of any of A21-A24, the substrate includes a waveguide, and the portion of the silicon cap layer is located at a sufficient lateral distance from the waveguide to prevent optical coupling between the waveguide and the electrical contact.

A26. In some embodiments, in the method of A25, the lateral distance is at least 800 nm.

A27. In some embodiments, the method of any of A17-A26 further comprises obtaining the substrate. In some embodiments, obtaining the substrate comprises: patterning a semiconductor layer of a semiconductor-on-insulator wafer to form a waveguide; depositing a dielectric layer over the waveguide; and planarizing the dielectric layer.

A28. The method of any of A17-A27, the superconductor material includes niobium and one or more of nitrogen, titanium, aluminum, germanium, and tin.

A29. The method of any of A17-A27, the superconductor material includes niobium nitride.

A30. The method of any of A17-A29, the silicon cap layer includes one or more of amorphous silicon, polysilicon, and single-crystal silicon.

A31. The method of any of A17-A29, the silicon cap layer includes amorphous silicon.

A32. In some embodiments, the method of any of A17-A31 further comprises depositing a first protective layer after depositing the superconductor layer and before depositing the silicon cap layer, the protective layer including aluminum and nitrogen.

A33. In some embodiments, in the method of A32, the protective layer is 5-10 nm thick.

FIG. 1A is a plan view of an SNSPD 100 in an x-y plane according to some embodiments. As shown, SNSPD 100 includes a superconductor stack 102 including a nanowire portion 110, connector portions 121, 122, and contact portions 123, 124. Nanowire portion 110 includes parallel line segments 111 and joining segments 112 together forming a meandering superconducting nanowire. In some embodiments, as shown in the inset in FIG. 1A, which provides a zoomed-in view of a joining segment 112, the joining segment 112 can have a curved inner perimeter 113 between two neighboring line segments 111 joined by the joining segment 112. In some embodiments, the curved inner perimeter provides a smooth transition between the two neighboring line segments to minimize current crowding effects. In some embodiments, nanowire portion 110 is fabricated over an optical waveguide structure (or waveguide) 105 to improve optical coupling efficiency. In some embodiments, as shown in FIG. 1A, nanowire portion 110 is wider than waveguide 105 to further improve the optical coupling efficiency.

As an example, FIG. 1A shows an area occupied by nanowire portion 110 being somewhat rectangular in shape. In practice, the nanowire portion can have any of a variety of geometrical configurations. For example, the nanowire can form one or more U-shapes, as shown in FIG. 1F. In some embodiments, the nanowire portion 110 can have a geometry that is independent of that of waveguide 105, as discussed below with respect to FIG. 2D. Most generally, one or more embodiment disclosed herein can have any geometry without departing from the scope of the present disclosure.

As shown in FIG. 1A, contact portion 123 is connected to a first end 115 of nanowire portion 110 via connector portion 121, and contact portion 124 is connected to a second end 116 of nanowire portion 110 via connector portion 122. In some embodiments, SNSPD 100 further includes metal contacts (not shown in FIG. 1A) over contact portions 123, 124. To prevent or reduce optical coupling (e.g., evanescent coupling) between the metal contacts and waveguide 105, contact portions 123, 124 are disposed (e.g., spaced apart) at a distance D (e.g., a lateral distance measured in the x-y plane) from waveguide 105. Distance D is dependent on a wavelength of photons to be transferred via the waveguide 105. In some embodiments, distance D can be at least 500 nm, e.g., 800 nm. Superconductor stack 102 and waveguide 105 are disposed on a substrate 101.

Figure 1B:
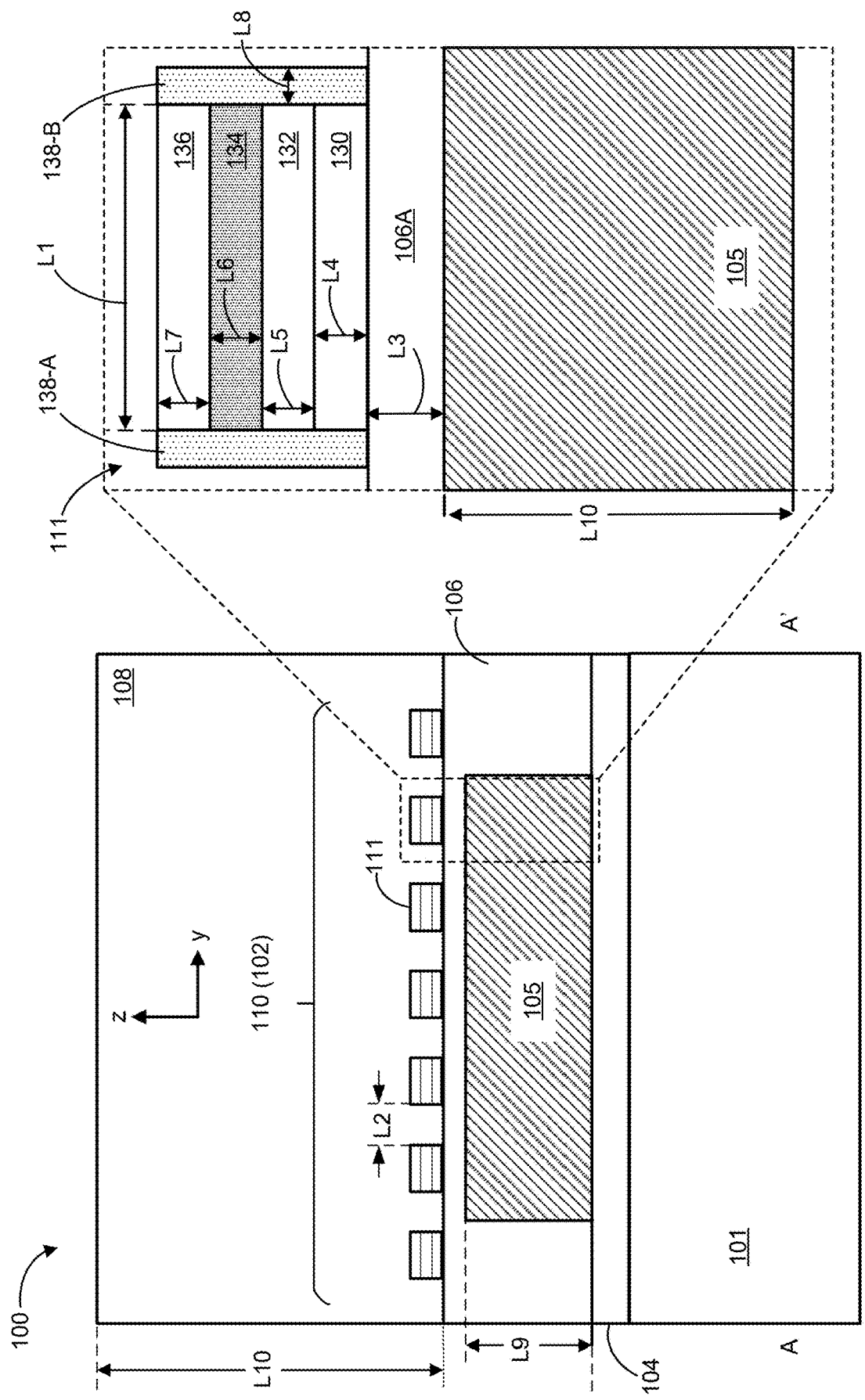
FIG. 1B is a cross-sectional view along line A-A' across a nanowire portion of the superconducting nanowire single photon detector shown in FIG. 1A in accordance with some embodiments.

FIG. 1B is a cross-sectional view of SNSPD 100 in an y-z plane cut across line segments 111 of nanowire portion 110 (along line A-A' in FIG. 1A), according to some embodiments. As shown, SNSPD 100 has a layered structure, including a first dielectric layer 104 over substrate 101, waveguide 105 over first dielectric layer 104, a second dielectric layer 106 over and around waveguide 105 and serving as cladding for waveguide 105, superconductor stack 102 over second dielectric layer 106, a third dielectric layer 108 encapsulating superconductor stack 102, and additional layers and structures not shown in FIG. 1B. In other words, first dielectric layer 104 is located between substrate 101 and waveguide 105, waveguide 105 is located between first dielectric layer 104 and a first portion of second dielectric layer 106, a second portion of second dielectric layer 106 is located around waveguide 105 and over first dielectric layer 104, and superconductor stack 102 is located between second dielectric layer 106 and a portion of third dielectric layer 108. In some embodiments, first dielectric layer 104 functions as a buffer layer between substrate 101 and waveguide 105 and has a thickness of at least 20 nm.

FIG. 1B also includes an inset showing a zoomed-in view of the cross-section of one of the line segments 111 and a corresponding portion of waveguide 105, according to some embodiments. As shown, multi-layer stack 102 includes a barrier layer 130, a seed layer 132 over the barrier layer 130, a superconductor layer 134 over the seed layer 132, and a silicon cap layer (or cap layer) 136 over the superconductor layer 134. In other words, seed layer 132 is located between barrier layer 130 and superconductor layer 134, and superconductor layer 134 is located between seed layer 132 and cap layer 136). SNSPD 100 may further include sidewalls 138-A and 138-B flanking opposing sides of superconductor stack 102. In some embodiments, barrier layer 130 includes silicon and nitrogen (e.g., silicon nitride), seed layer 132 includes aluminum and nitrogen (e.g., aluminum nitride), superconductor layer 134 includes niobium and one or more of nitrogen, titanium, aluminum, germanium, and tin (e.g., NbN, NbTi, NbAl, NbGe, NbSn, etc.), cap layer 136 includes silicon (e.g., amorphous silicon or a-Si, polysilicon or poly-Si, or single-crystal silicon or mono c-Si), and sidewalls 138-A and 138-B include silicon and nitrogen (e.g., silicon nitride).

As shown in FIG. 1B, a portion 106A of second dielectric layer 106 is located between waveguide 105 and barrier layer 130. Also, a portion of third dielectric layer 108 is located over the cap layer 136, and a portion of first dielectric layer 104 is located between waveguide 105 and substrate 101. FIGS. 1A and 1B illustrate some vertical and horizontal dimensions of SNSPD 100, as listed below:
- L1: width of superconducting layer 134 in each line segment 111 of nanowire portion 110;
- L2: width of space between two neighboring line segments 111 of nanowire portion 110;
- L3: thickness of the portion 106A of second dielectric layer 106;
- L4: thickness of barrier layer 130;
- L5: thickness of seed layer 132;
- L6: thickness of superconductor layer 134;
- L7: thickness of cap layer 136;
- L8: thickness of sidewalls 138-A and 138-B;
- L9: thickness of waveguide 105;
- L10: thickness of third dielectric layer 108;

In some embodiments:
- L1 is greater than 20 nanometers (nm) and less than 200 nm (i.e., 20 nm<L1<200 nm);
- L2 is greater than 20 nm and less than 300 nm (i.e., 30 nm<L2<300 nm);
- L3 is greater than 10 nm and less than 100 nm (i.e., 10 nm<L3<100 nm);
- L4, L5, L6 and L7 are each greater than 2 nm and less than 40 nm (i.e., 2 nm<L4, L5, L6, L7<40 nm);
- L8 is greater than 1 nm and less than 20 nm (i.e., 1<L8<20 nm);
- L9 is greater than 100 nm and less than 1 micrometer (μm) (i.e., 100 nm<L9<1 μm);
- L10 is greater than 800 nm and less than 100 μm (e.g., 800 nm<L10<20 μm); and In some embodiments:
- L1 is greater than 45 nm and less than 100 nm (i.e., 45 nm<L1<100 nm);
- L2 is greater than 45 nm and less than 200 nm (i.e., 45 nm<L2<200 nm);
- L3 is greater than 20 nm and less than 50 nm (i.e., 20 nm<L3<50 nm);
- L4 is greater than 5 nm and less than 20 nm (i.e., 5 nm<L4<20 nm);
- L5 and L6 are each greater than 5 nm and less than 20 nm (i.e., 5 nm<L5, L6<20 nm);
- L7 is greater than 3 nm and less than 20 nm (i.e., 3 nm<L7<20 nm);
- L8 is greater than 2 nm and less than 10 nm (i.e., 2<L8<10 nm);
- L9 is greater than 150 nm and less than 500 nm (i.e., 150 nm<L9<500 nm);
- L10 is greater than 1 μm and less than 10 μm (i.e., 1 μm<L10<10 μm);

In some embodiments, the width L1 and thickness L6 of superconductor layer 134 are selected based on the wavelength of the photons to be detected. In some embodiments, L10 is designed to be sufficiently large to prevent any optic coupling (e.g., evanescent coupling) between metal lines (not shown) formed over dielectric layer 108 and waveguide 105 or superconductor stack 102. In some embodiments, the sum of L3, L4, and L5 is small enough to enable optical coupling (e.g., evanescent coupling) between superconductor layer 134 and the waveguide 105 (e.g., L3+L4+L5<200 nm).

Figure 1C:
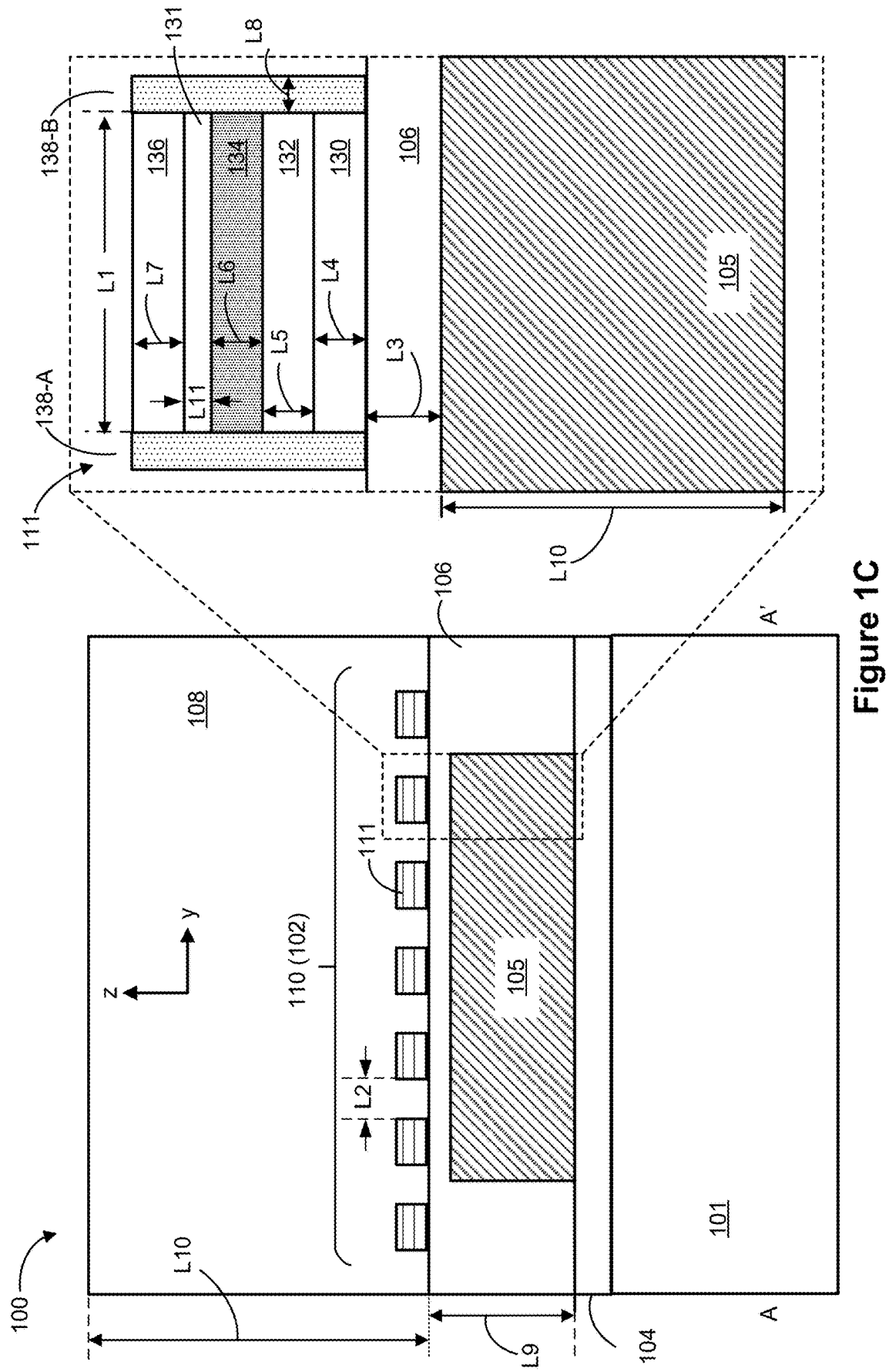
FIG. 1C illustrates a cross-sectional view of a superconducting nanowire single photon detector that includes a protective layer in accordance with some embodiments.

FIG. 1C is nearly identical to FIG. 1B except that the inset in FIG. 1C shows superconductor stack 102 further including an optional protective layer 131 between superconductor layer 134 and cap layer 136, according to some embodiments. In some embodiments, protective layer 131 includes aluminum and nitrogen (e.g., aluminum nitride). In some embodiments, the protective layer has a thickness L11 greater than 5 nm and less than 10 nm (e.g., 5 nm<L11<10 nm). In some embodiments, L11 greater than 1 nm and less than 5 nm (e.g., 1 nm<L11<5 nm) In some embodiments, protective layer 131 can be included to prevent oxidation of superconductor layer 134 during fabrication of SNSPD 100, if fabrication facilities used to fabricate SNSPD do not provide in-situ deposition of superconductor layer 134 and cap layer 136.

Figure 1D:
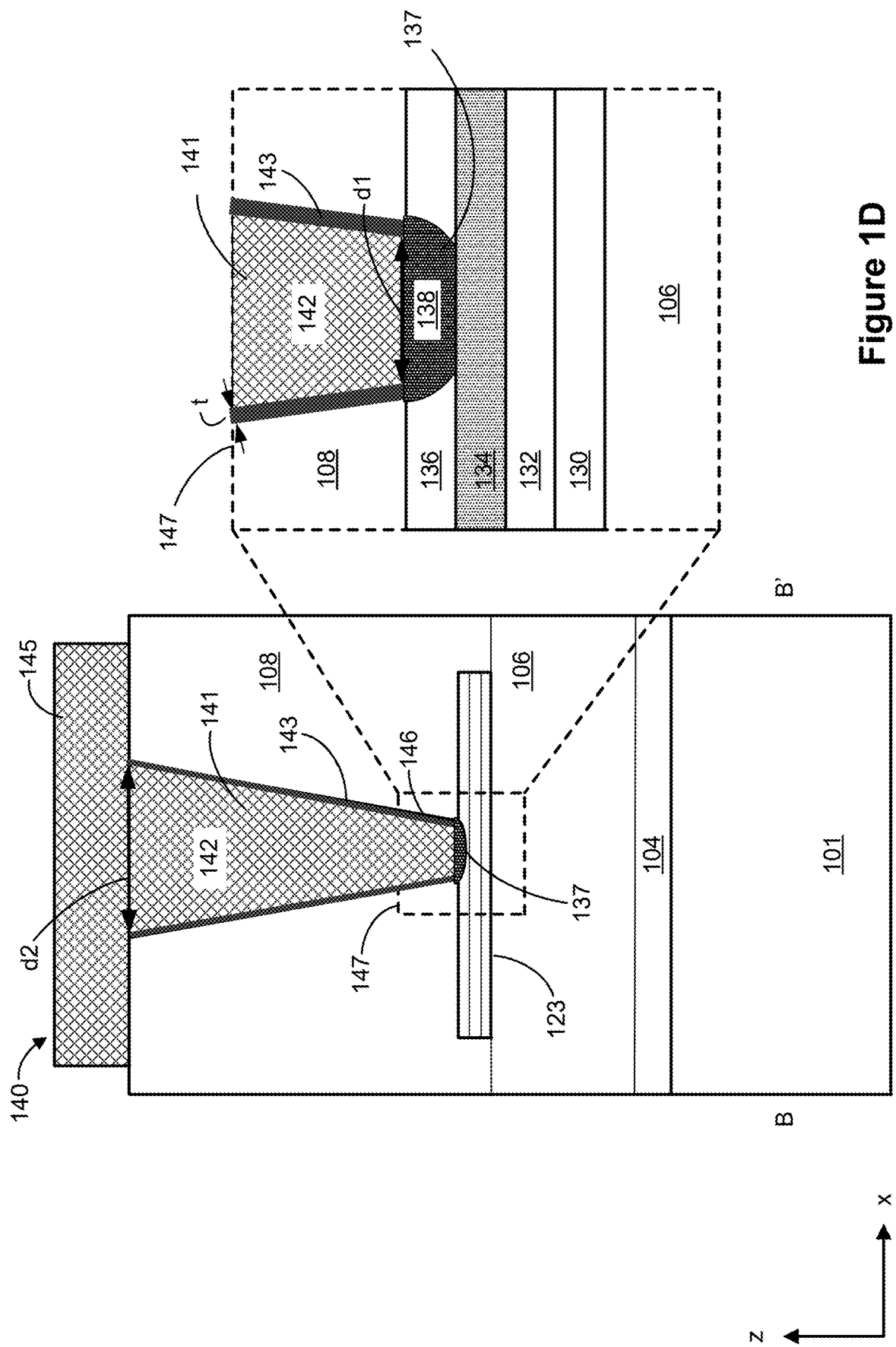
FIG. 1D is a cross-sectional view along line B-B' across a contact portion of the superconducting nanowire single photon detector shown in FIG. 1A in accordance with some embodiments.

FIG. 1D is a cross-sectional view of SNSPD 100 cut across contact portions 123 (along line B-B' in FIG. 1A), according to some embodiments. As shown, SNSPD 100 further includes a contact 140 above contact portion 123 of superconductor stack 102. According to some embodiments, contact 140 includes a contact core 141 in a contact hole 142 formed in dielectric layer 108. SNSPD 100 further includes a contact liner or outer layer 143 between contact core 141 and dielectric layer 108. Contact 140 further includes a contact pad (or metal line) 145 above and electrically coupled with contact core 141 and contact liner 143. Contact core 141 includes a metallic material, such as tungsten, aluminum, copper, etc. Contact liner 143 may include a same or different metallic material, such as titanium (Ti), nickel (Ni), cobalt (Co), etc. In some embodiments, as shown in FIG. 1D, contact hole 142 has a diameter (or horizontal dimension) d1 of about 100 nm or more near bottom 146 and a diameter (or horizontal dimension) d2 of about 100 nm or more near contact pad 145, and contact liner 143 has a thickness t1 of about 5 nm-100 nm.

FIG. 1D also includes an inset showing a zoomed in view of an area 147 near a bottom 146 of contact 140. As shown, a region 137 of cap layer 136 under and adjacent bottom 146 of contact 140 is converted to a conductive compound 138, which provides low-resistance electrical coupling between contact 140 and superconducting layer 134. In some embodiments, contact hole lining 143 includes Ti, Ni or Co and conductive compound 138 includes titanium silicide, nickel silicide, or cobalt silicide respectively.

Figure 1E:
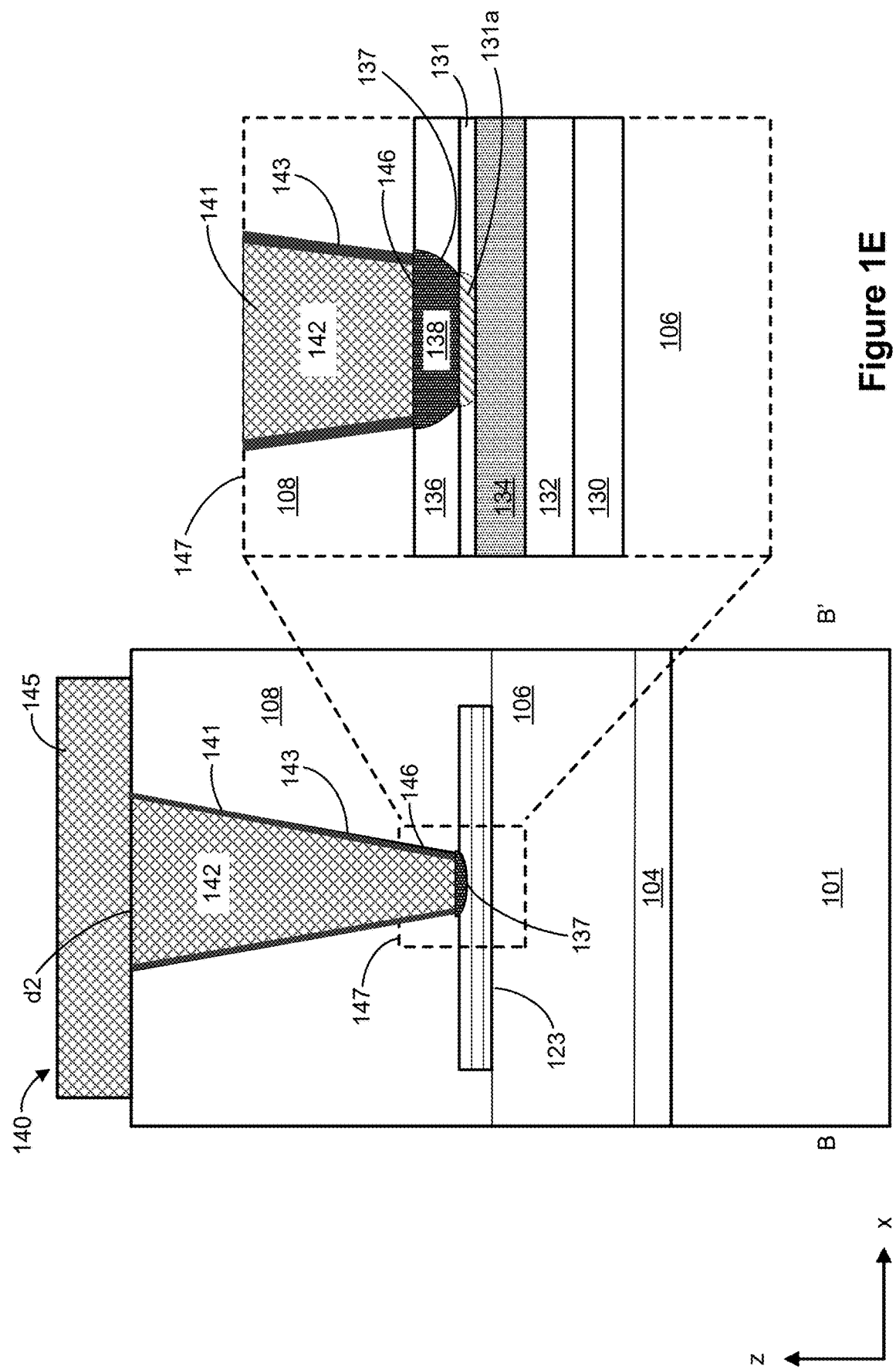
FIG. 1E illustrates a cross-sectional view of a superconducting nanowire single photon detector that includes a protective layer in accordance with some embodiments.
Figure 1F:
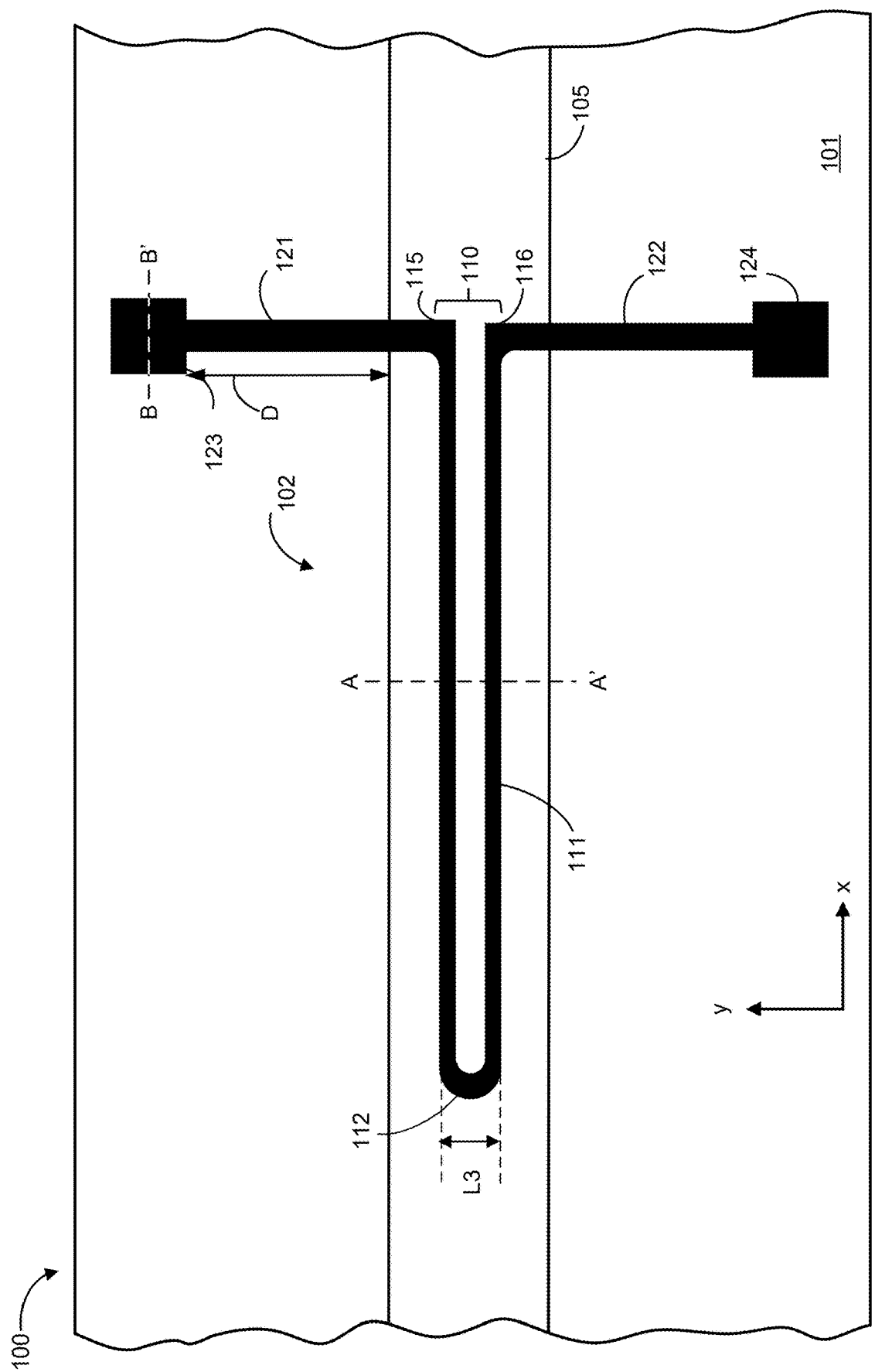
FIG. 1F illustrates another plan view of a superconducting nanowire single photon detector in accordance with some embodiments.

FIG. 1E illustrates a cross-sectional view of SNSPD 100 cut across contact portions 123 (along line B-B' in FIG. 1A), with an inset showing superconductor stack 102 further including a protective layer 131 between superconductor layer 134 and cap layer 136, according to some embodiments, as discussed above with reference to FIG. 1C. In some embodiments, as shown in the inset in FIG. 1E, when protective layer 131 is provided, contact hole 142 extends through protective layer 131.

Figure 2A:
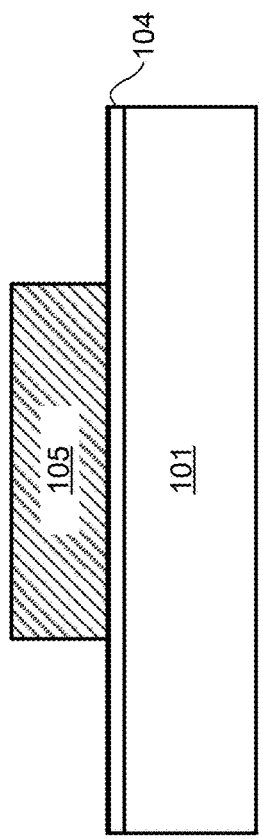
FIGS. 2A-2Q illustrate cross-sectional views of a superconducting nanowire single photon detector at various stages of a fabricating process in accordance with some embodiments.
Figure 2B:
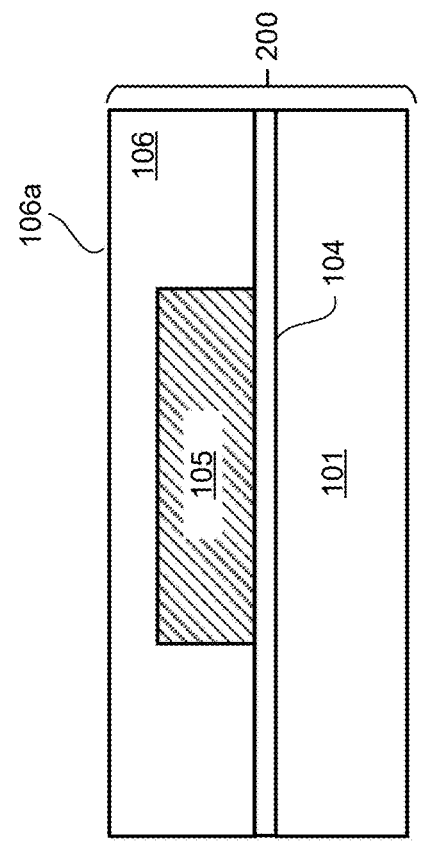
Figure 2C:
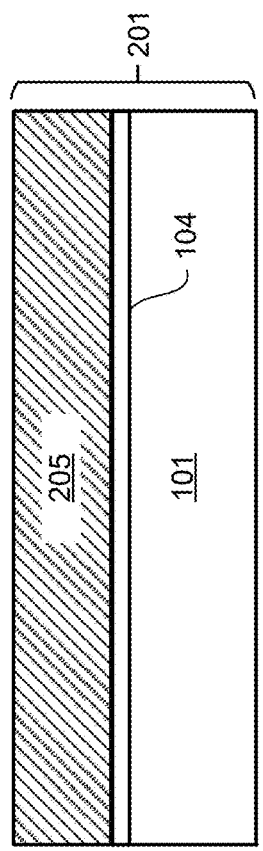
Figure 2D:
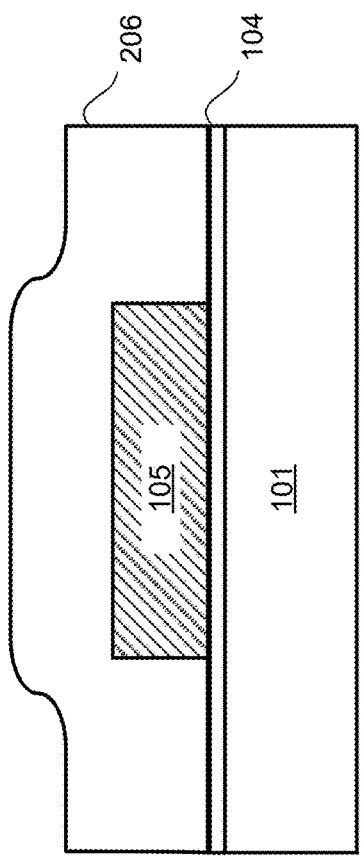
Figure 2E:
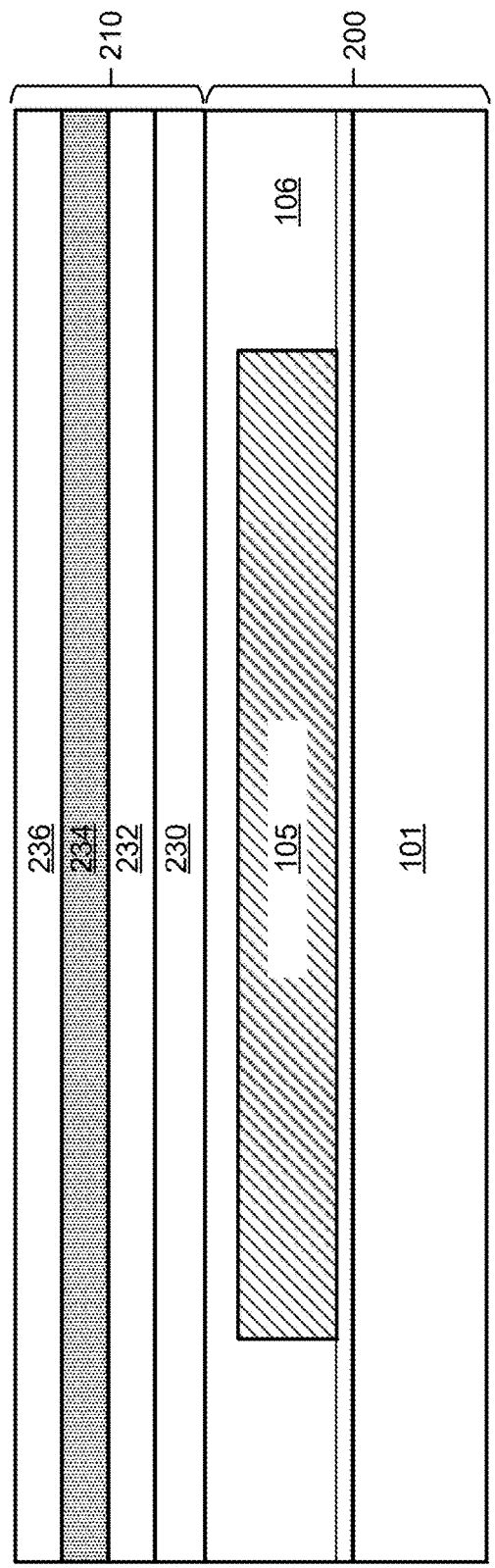
Figure 2F:
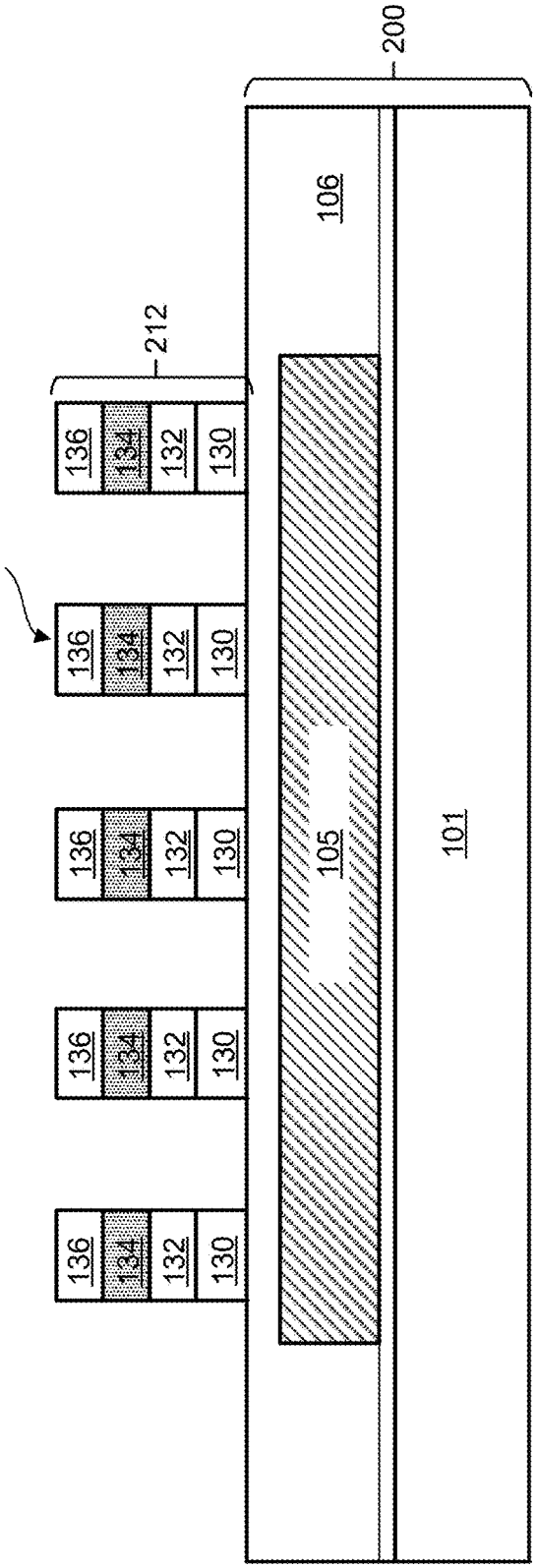
Figure 2G:
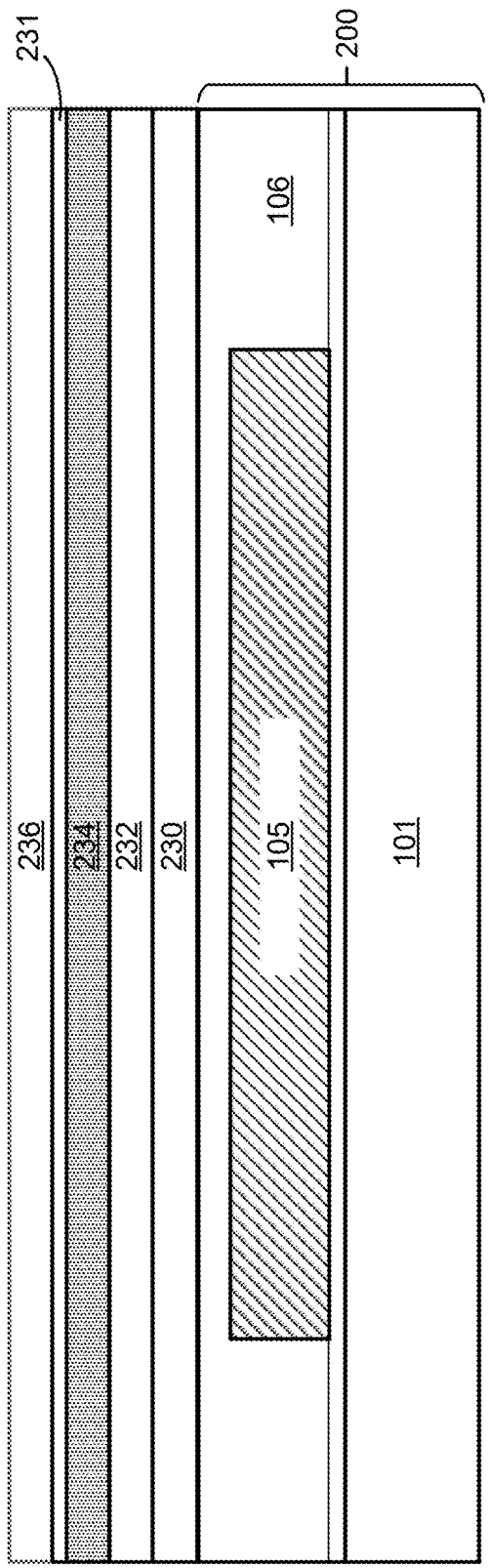
Figure 2H:
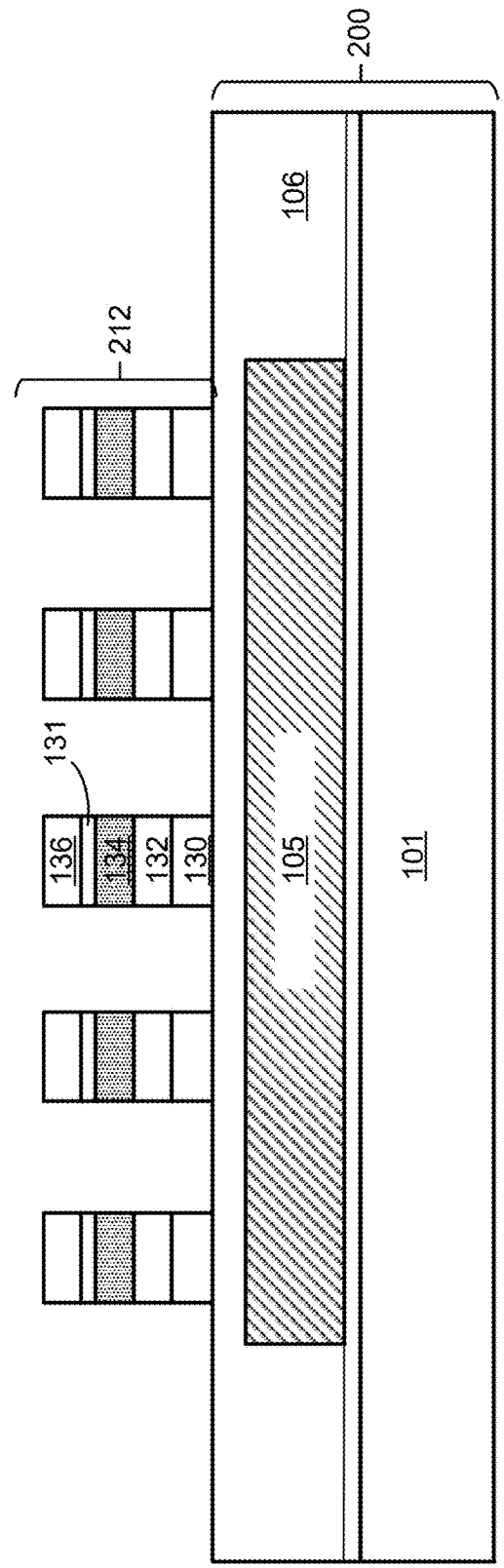
Figure 2J:
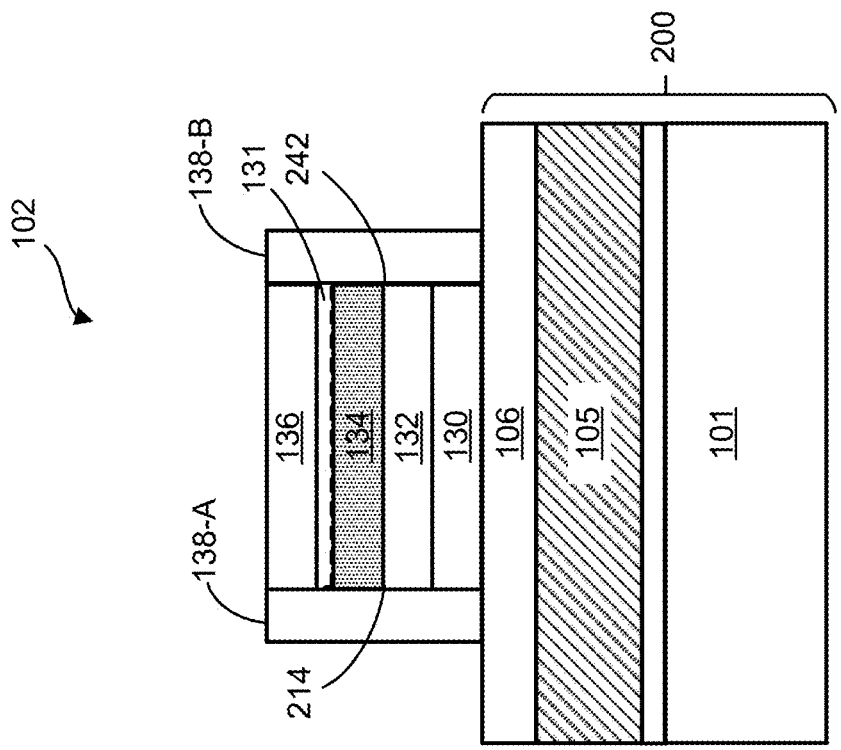
Figure 2I:
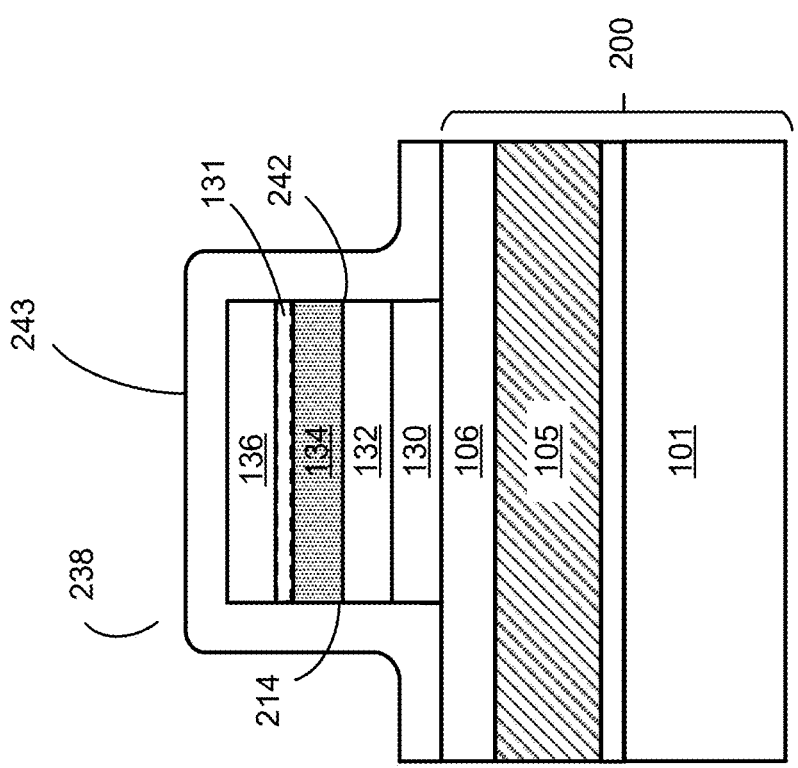
Figure 2M:
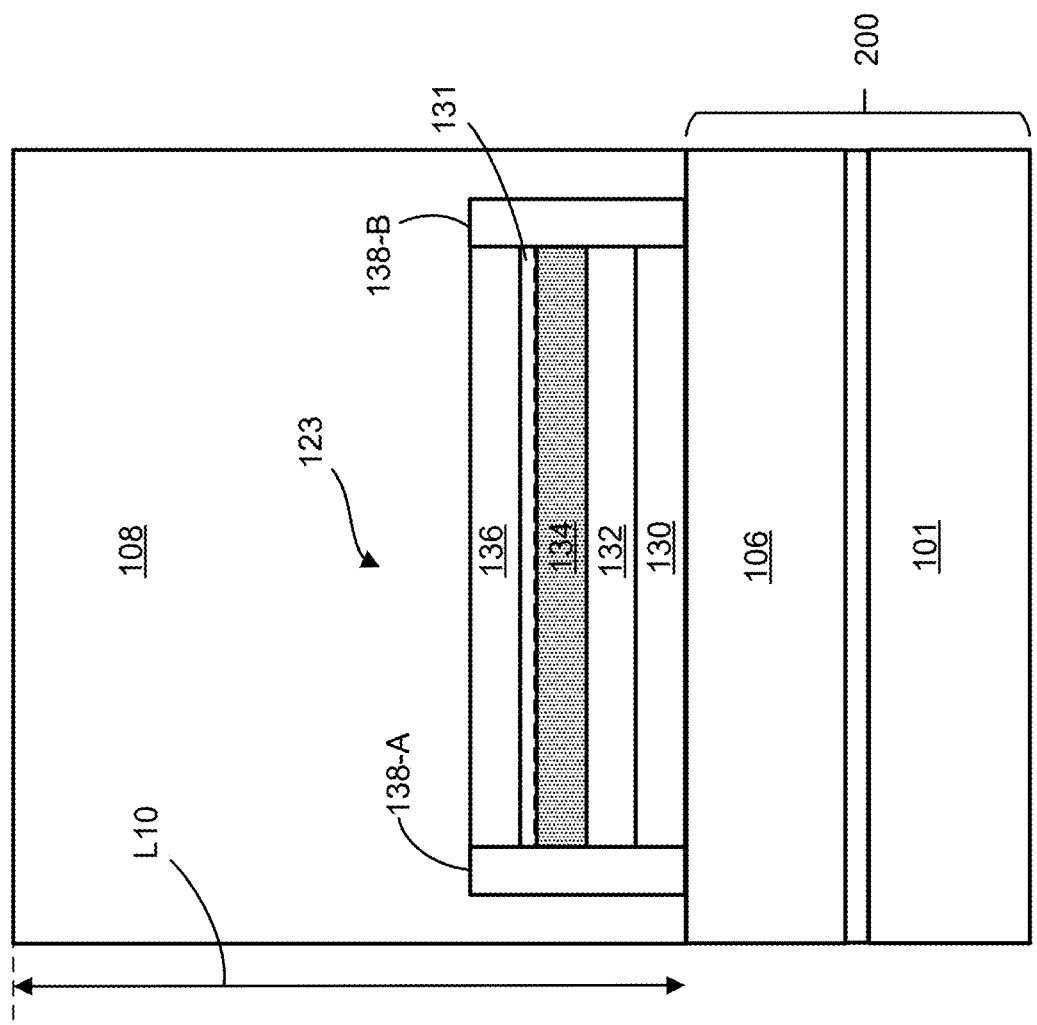
Figure 2O:
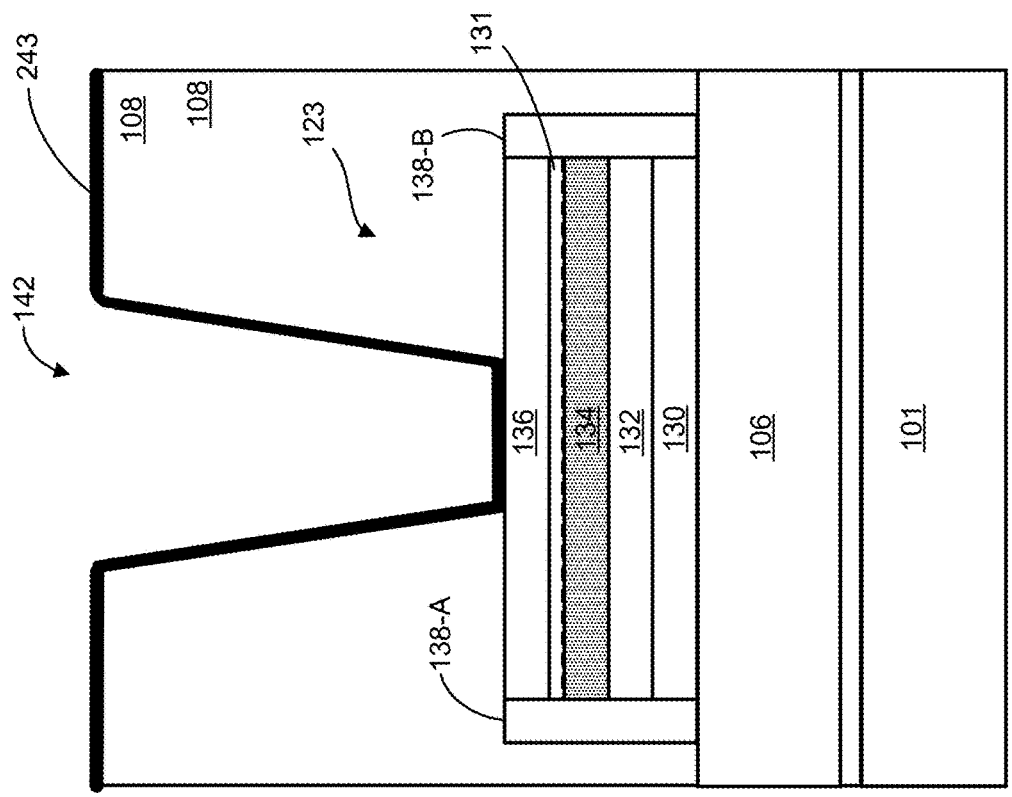
Figure 2N:
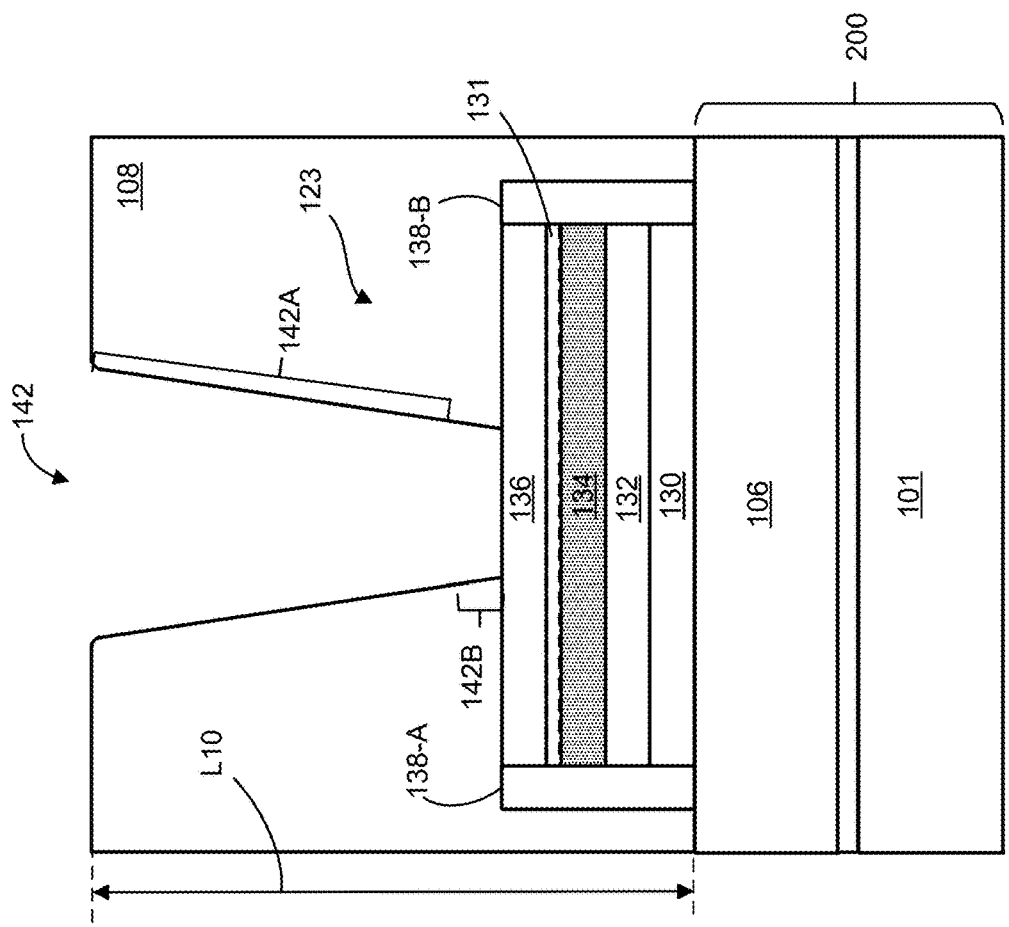
Figure 2Q:
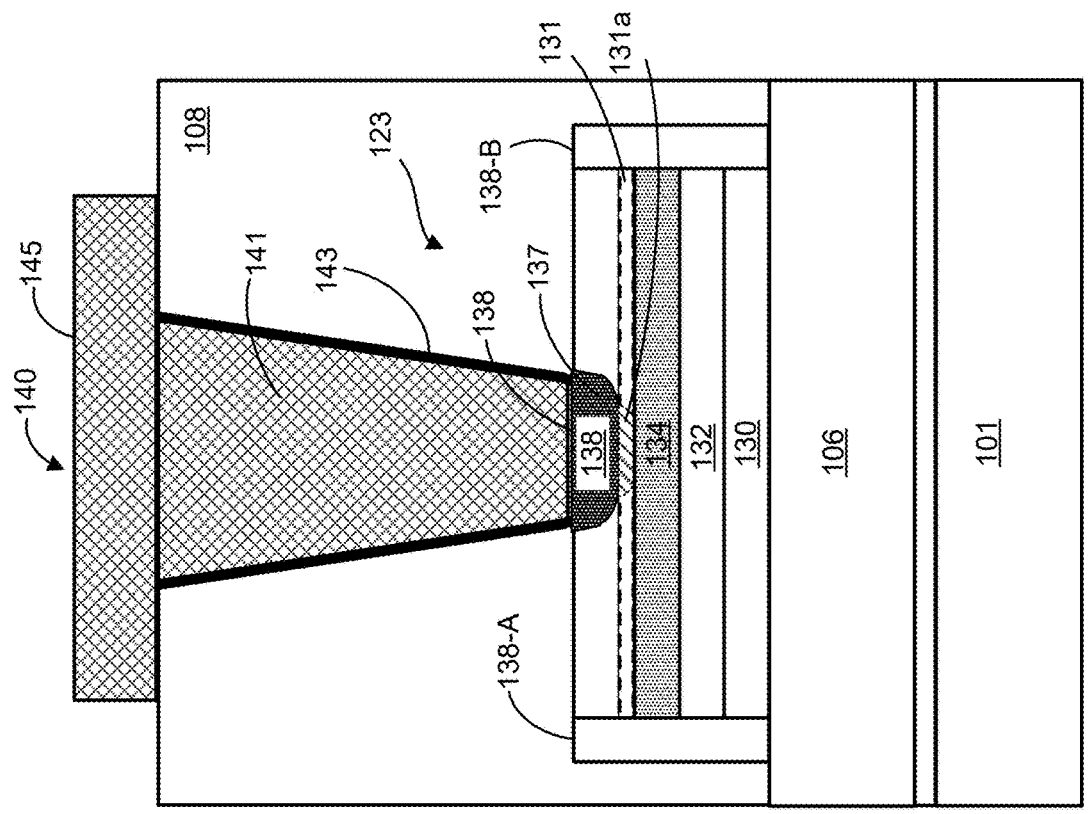
Figure 3:
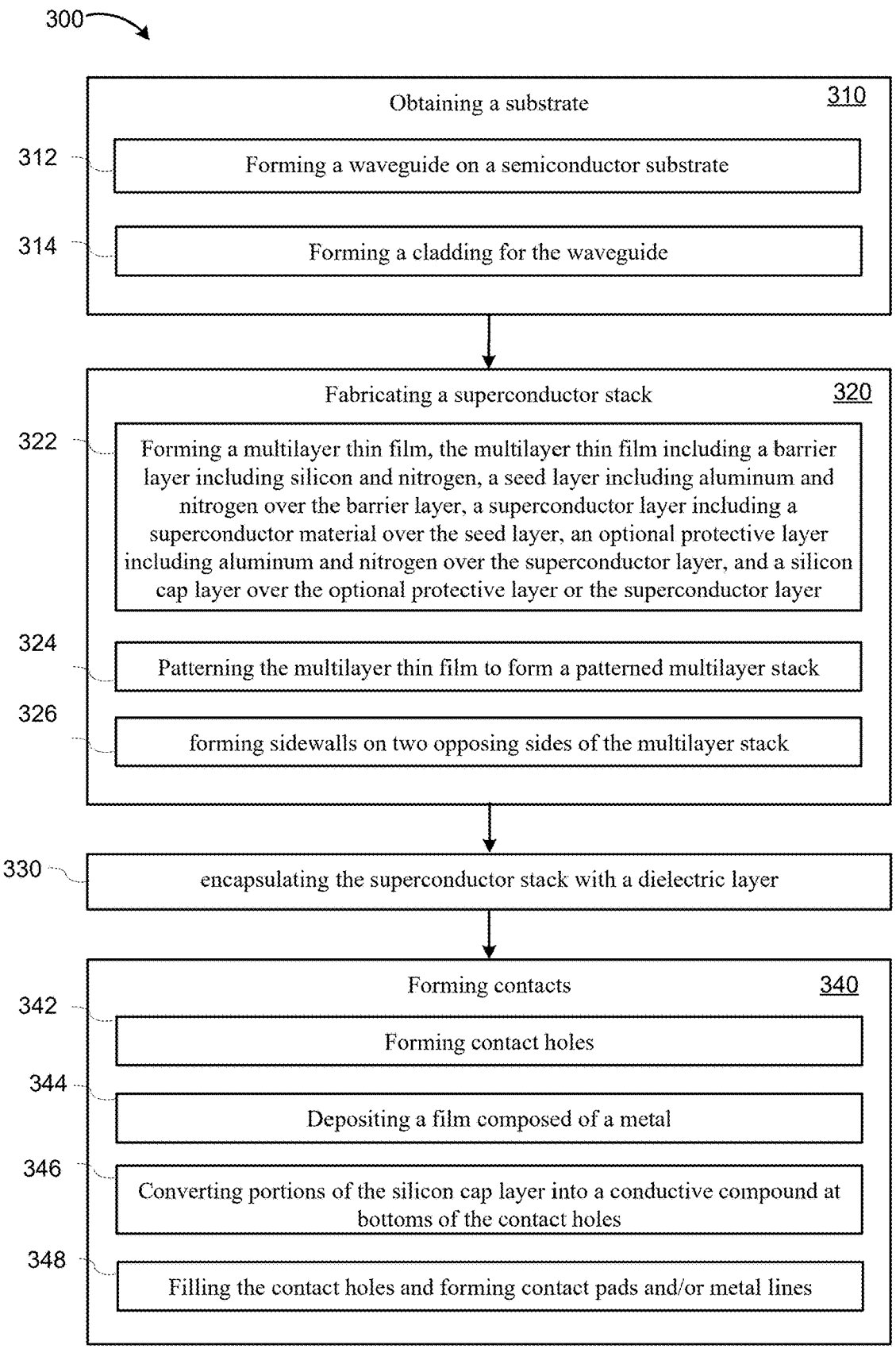
FIG. 3 illustrates a method of fabricating a superconducting nanowire single photon detector in accordance with some embodiments.

FIGS. 2A through 2Q, together with FIG. 3, illustrate a method 300 of manufacturing SNSPD 100, according to some embodiments. As shown in FIGS. 2A-2D and 3, method 300 includes obtaining a substrate (310). In some embodiment, as shown in FIG. 2A, obtaining a substrate (310) may start with a semiconductor-on-insulator (SOI) substrate 201 that includes a semiconductor (e.g., silicon, gallium arsenide, etc.) substrate 101, an insulator layer (e.g., dielectric layer 104) over the semiconductor substrate 101, and a semiconductor (e.g., silicon, gallium arsenide, etc.) film 205 over the insulator layer 104. As shown in FIG. 2B, obtaining a substrate (310) may further include patterning the semiconductor layer 205 (312) using, for example, photolithography and anisotropic etching (e.g., plasma or reactive ion etching), to form waveguide 105 on dielectric layer 104. As shown in FIGS. 2C and 2D, obtaining a substrate (310) may further include forming a dielectric layer (314) over waveguide 105 and dielectric layer 104, which may include, for example, depositing a dielectric (e.g., silicon dioxide) layer 206 over substrate 201 using, for example, chemical vapor deposition. Dielectric layer 206 is then planarized to form dielectric layer 106 using, for example, chemical mechanical polishing, resulting in a flat surface 106a, on which a superconductor nanowire of any of various shapes and dimensions can be fabricated. For example, the superconductor nanowire to be formed over the cladding (e.g., dielectric layer 106) of waveguide 105 can be wider than waveguide 105. In some embodiments, the obtained substrate (e.g., substrate 200) includes substrate 101, dielectric layer 104, waveguide 105, and dielectric layer 106, as shown in FIG. 2D.

As shown in FIG. 3, method 300 further includes fabricating a superconductor stack (320) over the obtained substrate (e.g., substrate 200). In some embodiments, as shown in FIGS. 3 and 2E, fabricating the superconductor stack (320) includes forming 322 on substrate 200 a multilayer thin film 210. In some embodiments, multilayer thin film 210 includes a layer of a first material 230, a layer of a second material 232 formed over (e.g., on top of, on a surface of) the layer of the first material 230, a layer of a third material 234 formed over (e.g., on top of, on a surface of) the layer of the second material 232, and a layer of a fourth material 236 formed over (e.g., on top of, on a surface of) the layer of the third material 234. In some embodiments, the layer of the first material 230 includes silicon and nitrogen (e.g., silicon nitride), the layer of the second material 232 includes aluminum and nitrogen (e.g., aluminum nitride), the layer of the third material 234 includes niobium and one or more of nitrogen, titanium, aluminum, germanium, and tin (e.g., NbN, NbTi, NbAl, NbGe, NbSn, etc.), and the layer of the fourth material 236 includes silicon (e.g., a-Si, poly-Si, or mono c-Si). In some embodiments, each layer in the multilayer thin film 210 has a thickness that is greater than 2 nm and less than 40 nm. In some embodiments, the layer of the first material 230 is greater than 10 nm and less than 20 nm, the layer of the second material 232 and the layer of the third material 234 are each greater than 5 nm and less than 10 nm, the layer of the fourth material 236 is greater than 3 nm and less than 10 nm.

In some embodiments, the layer of the first material 230 is deposited onto substrate 200 using a process suitable for depositing an ultrathin film (e.g., 10 nm-20 nm) including silicon and nitrogen (e.g., silicon nitride), such as, for example, chemical vapor deposition (CVD), physical vapor deposition (PVD), plasma-enhanced chemical vapor deposition (PECVD), catalytic chemical vapor deposition (Cat-CVD), hot wire chemical vapor deposition (HWCVD), etc. In some embodiments, the layer of the second material 232 is deposited onto the first layer of material 230 using a process suitable for depositing an ultrathin film (e.g., 5 nm-10 nm) including aluminum and nitrogen (e.g., aluminum nitride), such as, for example, CVD, PECVD, PVD, magnetron sputtering (MS), molecular beam epitaxy (MBE), atomic layer deposition (ALD), Plasma-Enhanced Atomic Layer Deposition (or PEALD), etc. In some embodiments, the layer of the third material 234 is deposited onto the layer of the second material 232 using a process suitable for depositing an ultrathin (e.g., 2 nm-40 nm) film including a superconductor compound (e.g., NbN, NbTi, NbAl, NbGe, or NbSn), such as, for example, CVD, PVD, PECVD, MS, MBE, ALD, PEALD, etc. In some embodiments, the layer of the fourth material 236 is deposited onto the layer of the third material 234 using a process suitable for depositing an ultrathin (e.g., 2 nm-40 nm) film including silicon (e.g., a-Si, poly-Si, or mono c-Si), such as, for example, CVD, PECVD, MS, MBE, ALD, PEALD, etc. In some embodiment, the layer of the fourth material 236 includes a-Si because a-Si can be deposited at relative low temperature (e.g., ~75 degrees Celsius) using a CVD process that causes little or no damage the underlying superconductor layer 234.

In some embodiments, as shown in FIGS. 3 and 2F, fabricating the superconductor stack (320) further includes patterning 324 multilayer thin film 210 to form a patterned multilayer stack 212 using a plurality of fabrication processes including, for example, a high-resolution lithography process to form a mask on multilayer thin film 210, and one or more anisotropic etching processes to successively etch away exposed portions of the layer of the fourth material 236, the layer of the third material 234, the layer of the second material 232, and the layer of the first material 230. At least the layer of the first material 230 is etched using an anisotropic process that is selective to dielectric layer 106. FIG. 2F shows a cross-sectional view of the resulting multilayer stack 212, according to some embodiments.

After multilayer stack 212 is formed by patterning 324 multilayer thin film 210, the remaining portion of the layer of the first material 230 becomes barrier layer 130, the remaining portion of the layer of the second material 232 becomes seed layer 132, the remaining portion of the layer of the third material 234 becomes superconducting layer 134, and the remaining portion of the layer of the fourth material 236 becomes cap layer 136. In some embodiments, the layer of the second material 232 acts as a seed layer for improved surface morphology during subsequent deposition of the layer of the third material 234, resulting in enhanced qualities of superconducting layer 134. Barrier layer 130 acts as a barrier between superconducting layer 134 and dielectric layer 106, preventing or reducing oxidation of superconducting layer 134 from oxygen released from dielectric layer 106 during and/or after fabrication of SNSPD 100.

In certain embodiments, as shown in FIG. 2G, multilayer thin film 210 further includes an optional layer of a fifth material 231 formed over the layer of the third material 234 and before forming the layer of the fourth material 236. In some embodiments, the layer of the fifth material 231 includes aluminum and nitrogen (e.g., aluminum nitride), and has a thickness that is greater than 1 nm and less than 10 nm, or greater than 1 nm and less than 5 nm. When multilayer thin film 210 further includes the layer of a fifth material 231, patterning 324 multilayer thin film 210 further includes etching the layer of the fifth material 231 after etching the layer of the fourth material 236 and before etching the other layers in the multilayer thin film 210, to form protective layer 131, as shown in FIG. 2H. In some embodiments, protective layer 131 can be used to protect superconductor layer 134 from exposure to atmosphere during fabrication of SNSPD 100. For example, if the fabrication facility/process chamber used to form the layer of the fourth material 236 (e.g., a-silicon) must be isolated from one or more materials that are used to form the layer of the third material 234 (e.g., NbN), substrate 101 or 200 may first need to be brought up to atmosphere and transferred from one process chamber that is used to deposit the NbN to another process chamber that is used to deposit a-silicon.

In some embodiments, as shown in FIG. 3, fabricating the superconductor stack 320 further includes forming 326 sidewalls on two opposing sides 241 and 242 of multilayer stack 212 by depositing a layer of sidewall materials 238 that conforms to contours of multilayer stack 212, as shown in FIG. 2I. In some embodiments, the layer of sidewall materials 238 can be deposited using, for example, chemical vapor deposition, to cover a top 243 and the two opposing sides 241 and 242 of multilayer stack 212, as well as portions of dielectric layer 106 not under (or covered) multilayer stack 212. Portions of the layer of sidewall material on top of multilayer stack 212 and on dielectric layer 106 are then removed in an anisotropic etching process, leaving sidewalls 138-A and 138-B on sides 241 and 242 of multilayer stack 212, respectively. The sidewall material 238 can be including, for example, silicon and nitrogen (e.g., silicon nitride), and the remaining sidewalls 138-A and 138-B each has a thickness greater than 500 Angstrom and less than 2 nm.

In some embodiments, as shown in FIGS. 3 and 2K, fabricating the superconductor stack (320) further includes subjecting substrate 200, along with the structures formed thereon, to an anneal process 328 to allow oxygen atoms or molecules 250 trapped in or near superconducting layer 134 to escape the multilayer stack 212. After the annealing process 328, the patterned multilayer stack 212, together with sidewalls 138-A and 138-B, become the fabricated superconductor stack, such as either of the superconductor stacks 102 shown in FIGS. 1A through 1C, according to some embodiments.

In some embodiments, as shown in FIGS. 3 and 2L, method 300 of manufacturing SNSPD 100 further includes encapsulating the superconductor stack (330) with a dielectric layer by depositing a thick layer of dielectric material (e.g., silicon dioxide) over substrate 200 and superconductor stack 102 formed thereon, using, for example, a CVD process, and by planarizing the thick layer of dielectric material using, for example, chemical mechanical polishing, to form the encapsulating dielectric layer (e.g., dielectric layer 108). In some embodiments, the encapsulating dielectric layer (e.g., dielectric layer 108) has a thickness L10 that is sufficiently large to prevent optical coupling (e.g., evanescent coupling) between metal lines (not shown) that are formed over dielectric layer 108 and waveguide 105 or superconductor stack 102. In some embodiments, thickness L10 is greater than 800 nm and less than 20 µm. In some embodiments, thickness L10 is greater than 1 µm and less than 10 µm.

In some embodiments, as shown in FIGS. 3 and 2M-2Q, method 300 of manufacturing SNSPD 100 further includes metallization processes 340 to form contacts over contact portions 123, 124 of superconductor stack 102. FIG. 2M is a cross-sectional view of contact portion 123 of superconductor stack 102 before the contacts are formed, showing contact portion 123 disposed over dielectric layer 106 and away from waveguide 105, as illustrated in FIG. 1A, according to some embodiments. As shown in FIGS. 3 and 2N, metallization processes 340 include forming 342 contact holes (e.g., contact hole 142 over contact portion 123) by etching dielectric layer 108 using one or more anisotropic etching process (e.g., plasma etching, or reactive ion etching or RIE) to allow bottoms of the contact holes to reach cap layer 136, as shown in FIG. 2N. In some embodiments, the one or more etching processes includes a first etching process for removing portions of dielectric layer 108 occupying upper portions of the contact holes (e.g., portion 142A of contact hole 142) and a second etching process for removing portions of dielectric layer 108 occupying lower portions of the contact holes (e.g., portion 142B of contact hole 142). The first etching process is an anisotropic etching process for etching the dielectric material in dielectric layer 108 with a relatively high etch rate. The second etching process is an anisotropic etching process for etching the dielectric material in dielectric layer 108 with a relatively low etch rate but with a high selectivity over the layer under dielectric layer 108 (e.g., cap layer 136). The etching process(es) with high selectivity is used to clear (e.g., remove) portions of dielectric layer 108 or portions of the optional protective layer 131 near the bottoms of the contact holes without punching through any part of cap layer 136. In some embodiments, the one or more etching processes for forming 342 contact holes can be any reactive ion etching processes for etch silicon dioxide that is selective to amorphous silicon. Thus, the cap layer can function as an etch-stop layer for forming the contact holes for SNSPD 100.

Figure 2P:
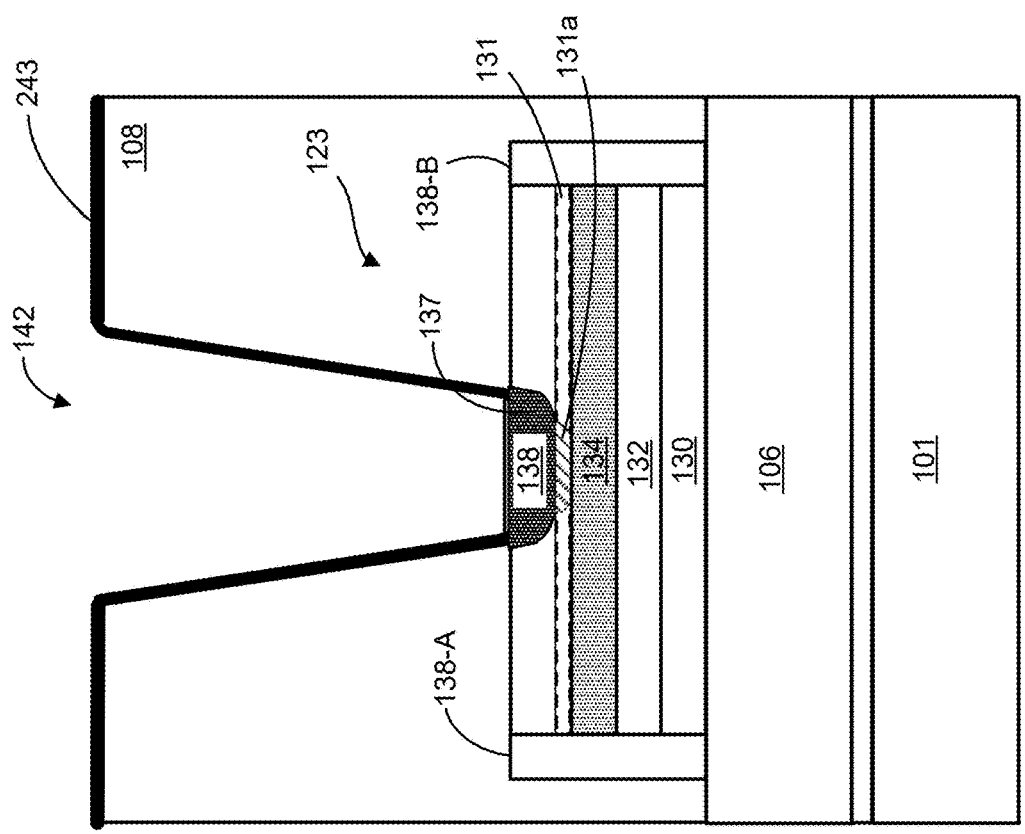

As shown in FIGS. 3 and 20, metallization processes 340 further includes depositing 344 a film 243 including a metal, such as Ti, Ni, Co, etc., or one or more compound thereof, over substrate 200 and the structures formed thereon using, for example, a PVD process. In some embodiments, the metal in film 243 is selected such that film 243 can be deposited at temperatures below 600 degrees Celsius. Film 243 is deposited to coat exposed surfaces of dielectric layer 108 (including walls of the contact holes), and exposed portions of cap layer 136 at the bottoms of the contact holes (e.g., contact hole 142). As shown in FIGS. 3 and 2P, metallization processes 340 further include silicide formation 346, during which the metal in film 243 diffuses into portions of cap layer 136 in contact with the metal film 243 at the bottoms of the contact holes (e.g., portion 137 under contact hole 142) resulting in such portions to be converted to silicide 138. Silicide formation 246 may include subjecting substrate 200, along with the structures formed thereon, to an annealing process, such as rapid thermal annealing (RTA). In some embodiments, the material in cap layer 136 and the metal(s) in film 243 are selected to enable formation of silicide 138 at temperatures below 600 degrees Celsius.

In some embodiments, when protective layer 131 is sufficiently thin (e.g., 5-10 nm in thickness), portions (e.g., portion 131a) of protective layer 131 under the silicide 138 can become conductive, resulting in the formation of ohmic contact through the protective layer 131 and a resulting contact resistance less than 10 ohms, which is the same or nearly the same as the contact resistance without protective layer 131.

Subsequent to silicide formation process 346, substrate 200 with the structures formed thereon is then etched to remove portions of film 243 covering a top surface 248 of dielectric layer 108. Portions of film 243 remaining on sidewalls of the contact holes become contact liners or outer layers for the metal contacts to be formed (e.g., contact liner or outer layer 143 in contact hole 142), as shown in FIG. 2P. As shown in FIGS. 3 and 2Q, metallization processes 240 further includes contact core formation 348, during which the contact holes (e.g., contact hole 142) are filled with contact cores (e.g., contact core 141). Contact pads (or metal line) (e.g., contact pad or metal line 145) can then be formed over contact core 141, using, for example, conventional processes for forming contact pads or metal line.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A superconductor device, comprising:
   a superconductor layer disposed over a substrate, the superconductor layer including a layer of a superconductor material;
   an oxidation barrier layer disposed between the superconductor layer and the substrate, the oxidation barrier layer configured to prevent oxidation of the superconductor layer;
   a seed layer for the superconductor layer, the seed layer disposed between the oxidation barrier layer and the superconductor layer; and
   a cap layer over the superconductor layer.

2. The superconductor device of claim 1, wherein the cap layer has a converted portion including a conductive compound; and
   the superconductor device further comprises a metal contact over the conductive compound and electrically coupled to the superconductor layer via the conductive compound.

3. The superconductor device of claim 2, wherein the metal contact comprises:
   a core including a first material; and
   an outer layer around the core and including a second material, wherein the conductive compound includes a silicide of the second material.

4. The superconductor device of claim 2, wherein the conductive compound is a metal compound.

5. The superconductor device of claim 2, further comprising a waveguide; and
   wherein the metal contact is at a sufficient lateral distance from the waveguide to prevent optical coupling between the metal contact and the waveguide.

6. The superconductor device of claim 5, further comprising:
   a dielectric layer disposed over the cap layer; and
   a conductive routing layer disposed over the dielectric layer;
   wherein the dielectric layer has a thickness sufficient to prevent optical coupling between the waveguide and the conductive routing layer.

7. The superconductor device of claim 1, further comprising one or more sidewalls disposed adjacent to the oxidation barrier layer, the seed layer, the superconductor layer, and the cap layer; and
   wherein the one or more sidewalls are configured to function as oxidation barriers for the superconductor layer.

8. The superconductor device of claim 7, wherein the one or more sidewalls are composed of silicon and/or nitrogen.

9. The superconductor device of claim 1, wherein the substrate includes:
a waveguide composed of a semiconductor material; and
a dielectric layer disposed over the waveguide, wherein the oxidation barrier layer is over the dielectric layer.

10. The superconductor device of claim 9, wherein the dielectric layer is composed of silicon dioxide.

11. The superconductor device of claim 9, wherein the substrate further includes a second dielectric layer disposed under the waveguide.

12. The superconductor device of claim 1, wherein the superconductor material is composed of one or more of niobium, nitrogen, titanium, aluminum, germanium, and tin.

13. The superconductor device of claim 1, wherein the cap layer includes one or more of amorphous silicon, polysilicon, and single-crystal silicon.

14. The superconductor device of claim 1, further comprising a second oxidation barrier layer disposed between the superconductor layer and the cap layer, the second oxidation barrier layer configured to prevent oxidation of the superconductor layer.

15. The superconductor device of claim 14, wherein the second oxidation barrier layer is 5 nm to 10 nm in thickness.

16. The superconductor device of claim 1, wherein a thickness of the superconductor layer is in a range of 2 nanometers (nm) to 40 nm.

17. The superconductor device of claim 1, wherein a thickness of the oxidation barrier layer is in a range of 2 nm to 40 nm.

18. The superconductor device of claim 1, wherein a thickness of the seed layer is in a range of 2 nm to 40 nm.

19. The superconductor device of claim 1, wherein the oxidation barrier layer is composed of silicon and/or nitrogen.

20. The superconductor device of claim 1, wherein the seed layer is composed of aluminum and/or nitrogen.

* * * * *